United States Patent
Yabe et al.

(10) Patent No.: US 11,081,167 B1
(45) Date of Patent: Aug. 3, 2021

(54) SENSE AMPLIFIER ARCHITECTURE FOR LOW SUPPLY VOLTAGE OPERATIONS

(71) Applicant: SANDISK TECHNOLOGIES LLC, Addison, TX (US)

(72) Inventors: Hiroki Yabe, Yokohama (JP); Koichiro Hayashi, Yokohama (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/912,716

(22) Filed: Jun. 26, 2020

(51) Int. Cl.
*G11C 11/4074* (2006.01)
*G11C 11/4091* (2006.01)

(52) U.S. Cl.
CPC ...... *G11C 11/4091* (2013.01); *G11C 11/4074* (2013.01)

(58) Field of Classification Search
CPC .................. G11C 11/4091; G11C 11/4074
See application file for complete search history.

(56) References Cited

U.S. PATENT DOCUMENTS

| | | | | |
|---|---|---|---|---|
| 5,629,638 A * | 5/1997 | Kumar | ................ | G06F 30/327 326/121 |
| 8,081,502 B1 * | 12/2011 | Rahim | ................ | G11C 11/412 365/154 |
| 9,543,030 B1 * | 1/2017 | Amarnath | .............. | G11C 16/26 |
| 9,576,673 B2 * | 2/2017 | Jiang | ...................... | G11C 16/26 |
| 10,037,810 B1 * | 7/2018 | Shukla | ................... | G11C 16/32 |
| 10,255,978 B2 * | 4/2019 | Louie | .................. | G11C 11/5628 |
| 10,910,030 B2 * | 2/2021 | Antonyan | ............ | G11C 11/161 |
| 2014/0119099 A1 * | 5/2014 | Clark | .................... | G11C 11/406 365/149 |
| 2017/0110186 A1 * | 4/2017 | Sasaki | ................ | G11C 11/5642 |
| 2017/0154672 A1 * | 6/2017 | Menezes | ............. | G11C 11/419 |

* cited by examiner

*Primary Examiner* — Khamdan N. Alrobaie
(74) *Attorney, Agent, or Firm* — Vierra Magen Marcus LLP

(57) ABSTRACT

Systems and methods for reducing the energy per bit of memory cell sensing operations, such as memory read operations, by dynamically adjusting the body effect of data latch transistors during the sensing operations are described. A significant component of the energy required to perform the memory cell sensing operations may correspond with the parasitic currents through low threshold voltage (VT) transistors of data latches within sense amplifier circuits. In order to reduce the energy per bit of the memory cell sensing operations while using a reduced supply voltage for the data latches, the body effect of a select number of the low VT transistors within the data latches may be dynamically adjusted such that the body effect is minimized or nonexistent during the latching of new data into the data latches and then increased after the new data has been latched within the data latches.

18 Claims, 18 Drawing Sheets

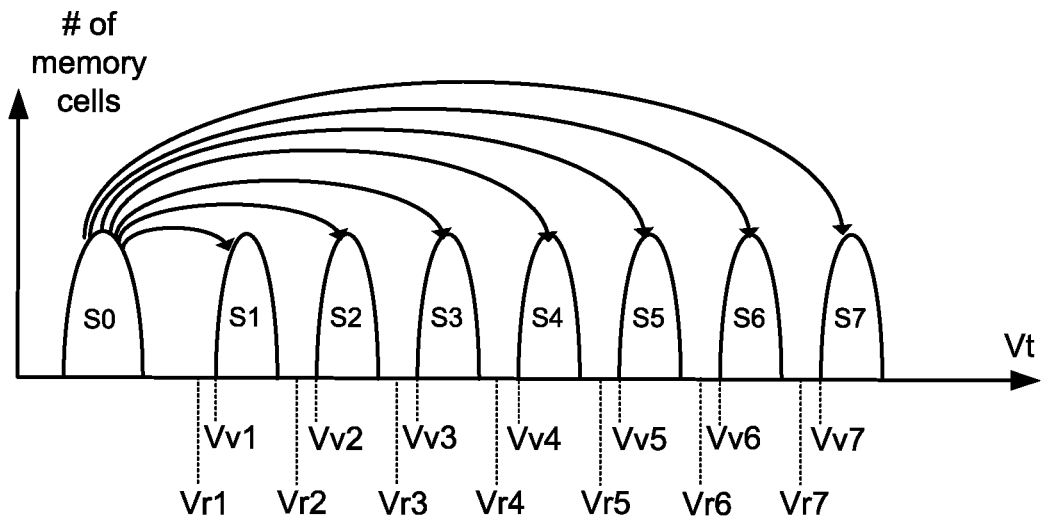
FIG. 5
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |
FIG. 6A
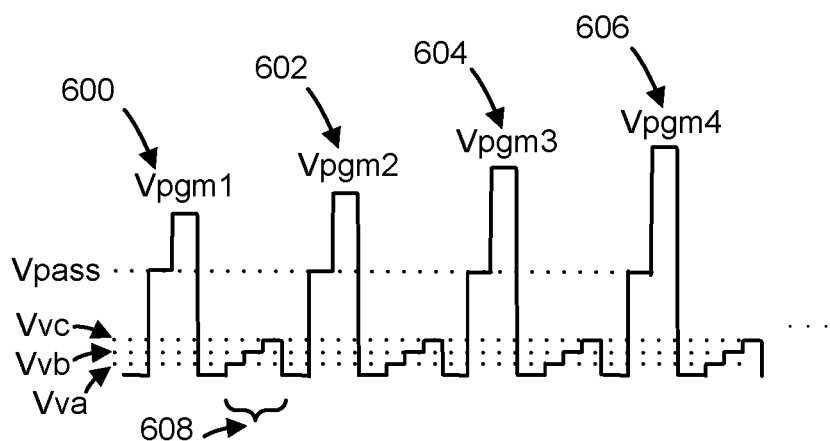
FIG. 6B

SENSE AMPLIFIER ARCHITECTURE FOR LOW SUPPLY VOLTAGE OPERATIONS

BACKGROUND

The growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives (SSDs). Semiconductor memory devices may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

It is common for semiconductor memory die to be placed into a package to allow for easier handling and assembly, and to protect the die from damage. Although a plural form of "die" is "dice," it is common industry practice to use "die" as a plural form as well as the singular form. In one example, one or more semiconductor memory die and other integrated circuits, such as processors, may be encased within a package wherein the die may be stacked on top of one another within the package. The package may comprise a surface-mount package, such as a BGA package or TSOP package. One benefit of vertically stacking numerous die within a package (e.g., stacking eight die within a single package) is that the overall form factor and package size may be reduced. In some cases, the package may comprise a stacked multi-chip package, a system-in-package (SiP), or a chip stack multichip module (MCM). Vertical connections between the stacked die including direct vertical connections through a die's substrate (e.g., through a silicon substrate) may be formed within each die before or after die-to-die bonding. The vertical connections may comprise through-silicon vias (TSVs).

BRIEF DESCRIPTION OF THE DRAWINGS

Like-numbered elements refer to common components in the different figures.

FIG. 5 depicts threshold voltage distributions.

FIG. 6A is a table describing one example of an assignment of data values to data states.

FIG. 6B depicts one embodiment of a series of program and verify pulses which are applied to a selected word line during a programming operation.

DETAILED DESCRIPTION

Figure 1:
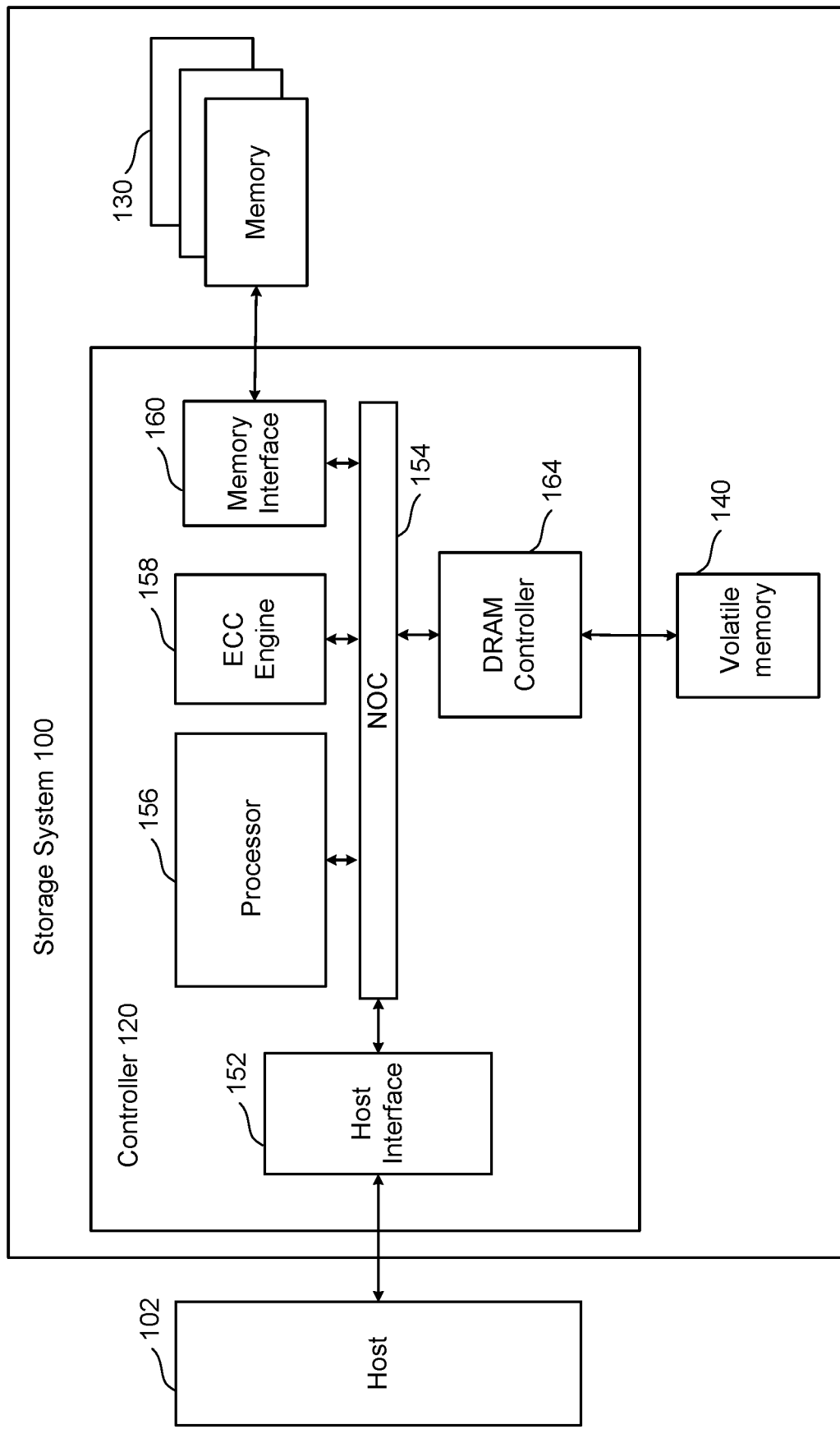
FIG. 1 is a block diagram depicting one embodiment of a memory system.

Technology is described for improving the performance and energy efficiency of memory cell sensing operations by dynamically adjusting the body effect of data latch transistors within sense amplifier circuits during the sensing operations. The memory cell sensing operations may comprise read operations or program verify operations. The data states of a plurality of memory cells may be determined using a plurality of sense amplifier circuits and data corresponding with the data states of the plurality of memory cells may be stored using a plurality of data latches. In one example, a sense amplifier circuit may determine a data state associated with a particular threshold voltage of a memory cell transistor and store two bits corresponding with the data state using two data latches. In some cases, the total number of data latches on a die (e.g., on a CMOS die or a memory die) may comprise over a million data latches. A significant component of the energy per bit of memory cell sensing operations may correspond with parasitic currents through transistors of the data latches. The parasitic currents may include leakage currents through low threshold voltage (VT) transistors when the low VT transistors are set into a non-conducting state. One technical benefit of using low VT transistors within the data latches for storing memory cell data is that the supply voltage for the data latches (e.g., VDD_SA) may be reduced (e.g., from 1.8V to 1.5V) which may reduce the energy per bit of memory cell sensing operations. However, a technical issue with using low VT transistors within the data latches is that parasitic currents may increase which may increase the energy per bit of memory cell sensing operations. In order to reduce the energy per bit of memory cell sensing operations while using a reduced supply voltage for the data latches, the body effect of a select number of the low VT transistors within the data latches may be dynamically adjusted such that the body effect is minimized or nonexistent during the latching of new data into the data latches and then increased after the new data has been latched within the data latches.

In some cases, as the bulk voltage (or body voltage) of an NMOS transistor drops below the source voltage of the NMOS transistor and the voltage difference between the bulk voltage and the source voltage becomes more negative, the width of the depletion region formed under the gate will increase causing the threshold voltage for the NMOS transistor to increase. This effect in which an increase in the source to bulk voltage of the NMOS transistor causes the threshold voltage of the NMOS transistor to increase may be referred to as the "body effect." PMOS transistors may also experience the body effect as the bulk to source voltage of the PMOS transistor increases.

Sense amplifier circuits for sensing currents through memory cells and determining data states of the memory cells may utilize localized data latches to store or temporarily buffer data associated with the determined data states. The data latches may be set into a higher speed, higher power configuration when receiving new data to be latched and then set into a lower speed, lower power configuration after the data has been latched. During a memory read operation, the sense amplifier circuits may dynamically adjust the body effect of low VT NMOS transistors in order to trade-off circuit performance for circuit power. In some embodiments, in order to raise the threshold voltage of a low VT NMOS transistor used in a data latch after new data has been latched to reduce subthreshold leakage currents through the low VT NMOS transistor when the low VT NMOS transistor is cut off or placed into a non-conducting state, the source to bulk voltage for the low VT NMOS transistor may be set to at least a first voltage difference (e.g., 0.7V). In one example, the source to bulk voltage for the low VT NMOS transistor may be set to the first voltage difference by applying 0.7V to the source of the low VT NMOS transistor and 0V to the PWELL body of the low VT NMOS transistor. In another example, the source to bulk voltage for the low VT NMOS transistor may be set to the first voltage difference by applying 0V to the source of the low VT NMOS transistor and −0.7V to the PWELL body of the low VT NMOS transistor. In another example, the source to bulk voltage for the low VT NMOS transistor may be set to the first voltage difference by applying positive 350 mV to the source of the low VT NMOS transistor and negative 350 mV to the PWELL body of the low VT NMOS transistor.

The determination of whether to adjust the source voltage or the bulk voltage that is applied to the low VT NMOS transistors within the data latches may depend on a chip temperature and the number of data latches that are enabled. The amount of current loss due to parasitic currents through the data latches may increase with increased chip temperature and with the number of data latches set into an enabled state that does not prevent parasitic currents. In one example, if the chip temperature is greater than a threshold temperature (e.g., is greater than 55 degrees Celsius), then the minimum source voltage applied to the low VT NMOS transistors may be set to 0.7V; however, if the chip temperature is not greater than the threshold temperature, then the minimum source voltage applied to the low VT NMOS transistors may be set to 0V. In another example, if the chip temperature is less than a threshold temperature (e.g., is less than 55 degrees Celsius), then the PWELL body voltage applied to the low VT NMOS transistors may be set to 0V; however, if the chip temperature is not less than the threshold temperature, then the PWELL body voltage applied to the low VT NMOS transistors may be set to −1V. In another example, if the number of data latches is greater than a threshold number of data latches (e.g., is greater than 8K data latches), then the minimum source voltage applied to the low VT NMOS transistors may be set to 0.7V; however, if the number of data latches is not greater than the threshold number of data latches, then the minimum source voltage applied to the low VT NMOS transistors may be set to 0V.

To reduce memory system cost and energy consumption, one or more memory array die and one or more CMOS die may be vertically stacked and electrically connected together. Each CMOS die may include memory array support circuitry such as voltage regulators, charge pumps, sense amplifiers, page registers, and/or state machines. Each CMOS die may include peripheral I/O circuits to support the one or more memory die, specialized cores to accelerate specific application domains (e.g., ECC, compression, filtering, reconfigurable logic, etc.), and lightweight CPUs to support the general application domain. The peripheral I/O circuits may include sense amplifiers, decoders, charge pumps, etc. The memory array die may comprise various memory structures including planar NAND structures, vertical NAND structures, Bit Cost Scalable (BiCS) NAND structures, 3D NAND structures, or 3D ReRAM structures.

In some cases, a plurality of stacked die may include a first set of CMOS die and a second set of memory array die. The CMOS die may be physically smaller or have less die area than the memory array die and utilize a less expensive fabrication process than the memory array die. The plurality of stacked die may include a first memory array die arranged on a first layer and two or more different CMOS die arranged on a second layer positioned above the first layer. A second memory array die may then be arranged on a third layer above the second layer. In this case, a combination of horizontal bussing and vertical bussing along with crossbar switch transistors may allow each of the CMOS die within the plurality of stacked die to electrically connect with either the first memory array die or the second memory array die. Vertical and horizontal crossbar structures may be used to allow each of the CMOS die to connect to any of the memory array die within the plurality of stacked die. A vertical connection may be made through a die's substrate using a TSV. In one example, a crossbar structure using one or more TSVs may connect an internal node (e.g., a bit line node) within a first memory array die of the plurality of stacked die with an internal node (e.g., a sense amplifier node) of a second die of the plurality of stacked die.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 1-2 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate.

FIG. 1 is a block diagram of one embodiment of a memory system 100 that implements the proposed technology, including countermeasures for avoiding unrecoverable errors due to over programming. In one embodiment, storage system 100 is a solid state drive ("SSD"). Memory system 100 can also be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 120 connected to one or more memory die 130 and local high speed volatile memory 140 (e.g., DRAM). The one or more memory die 130 each comprise a plurality of non-volatile memory cells. More information about the structure of each memory die 130 is provided below. Local high speed volatile memory 140 is used by controller 120 to perform certain functions. For example, local high speed volatile memory 140 stores logical to physical address translation tables ("L2P tables").

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system may use logical addresses to address the various memory locations. This enables the host to assign data to consecutive logical addresses, while the storage system is free to store the data as it wishes among the locations of the one or more memory die. To implement this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with one or more memory die 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
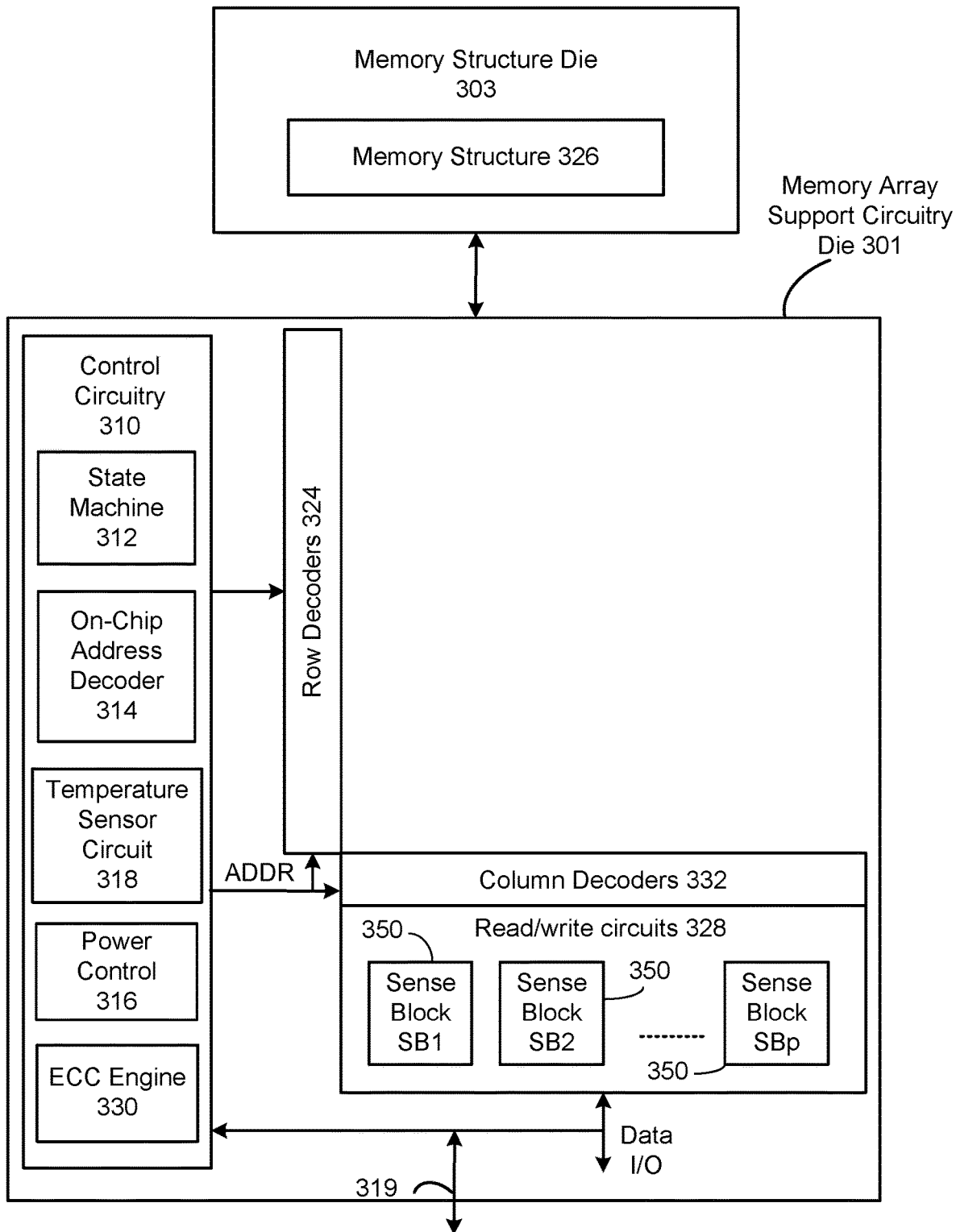
FIG. 2A depicts one embodiment of two separate die.

FIG. 2A depicts one embodiment in which elements of a memory system are grouped into two separate die comprising the memory structure die 303 (e.g., a die with only the memory array structures) and the memory array support circuitry die 301 (e.g., a die comprising the control circuits that facilitate memory operations for the memory structure 326). In some cases, the memory structure die 303 and the memory array support circuitry die 301 may be bonded together or arranged as a vertical stack of die within an integrated memory assembly. The memory structure die 303 may include non-volatile memory cells and the word lines and bit lines for accessing the non-volatile memory cells. The arrangement of the control circuits for performing memory operations (e.g., read and write operations) using the memory structure 326 on the memory array support circuitry die 301 allows the control circuits (e.g., row decoders, column decoders, and read/write circuits) to be fabricated using a different process technology compared with the process technology used for fabricating the memory structure die 303. Thus, the memory structure die 303 may be optimized for the memory array structure without worrying about the CMOS elements or control circuitry.

In some cases, the memory structure 326 can be formed on one die, such as the memory structure die 303, and some or all of the peripheral circuitry elements, including one or more control circuits, can be formed on a separate die, such as the memory array support circuitry die 301. In one example, the memory structure die 303 can be formed of just a memory array of memory elements, such as an array of memory cells of flash NAND memory, PCM memory, or ReRAM memory. In some cases, each of the one or more memory die 130 of FIG. 1 may correspond with the memory structure die 303 of FIG. 2A.

In reference to FIG. 2A, the word lines within the memory structure 326 may be biased by the row decoders 324 within the memory array support circuitry die 301 and the bit lines within the memory structure 326 may be biased by the column decoders 332 within the memory array support circuitry die 301. The read/write circuits 328 include multiple sense blocks 350 including SB1, SB2, . . . , SBp (sensing circuitry) and allow a page (or multiple pages) of data in multiple memory cells to be read or programmed (written) in parallel. In one embodiment, each sense block includes a sense amplifier and a set of latches. The latches store data to be written and/or data that has been read. Commands and data may be transferred between a controller, such as controller 120 in FIG. 1, and the memory array support circuitry die 301 via lines 319.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316, a temperature sensor circuit 318, and an ECC engine 330. The ECC engine 330 may generate ECC codes for protecting data to be stored within the memory structure 326. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a programmable microcontroller or microprocessor. In one embodiment, control circuitry 310 includes buffers such as registers, ROM fuses and other storage devices for storing default values such as base voltages and other parameters. Temperature sensor circuit 318 detects a die temperature for the memory array support circuitry die 301.

In some embodiments, one or more of the components (alone or in combination) within the memory array support circuitry die 301 may be referred to as a managing or control circuit. For example, one or more managing or control circuits may include any one of or a combination of control circuitry 310, state machine 312, decoder 314, power control 316, sense blocks 350, or read/write circuits 328. The one or more managing circuits or the one or more control circuits may perform or facilitate one or more memory array operations including erasing, programming, or reading operations.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 may be arranged in vertical NAND strings. In another embodiment, memory structure 326 comprises a two dimensional memory array of non-volatile memory cells. In one example, the non-volatile memory cells are NAND flash memory cells utilizing floating gates.

The exact type of memory array architecture or memory cell included in memory structure 326 is not limited to the examples above. Many different types of memory array architectures or memory cell technologies can be used to form memory structure 326. Other examples of suitable technologies for memory cells of the memory structure 326 include ferroelectric memories (FeRAM or FeFET), ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a Ge2Sb2Te5 alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 2B:
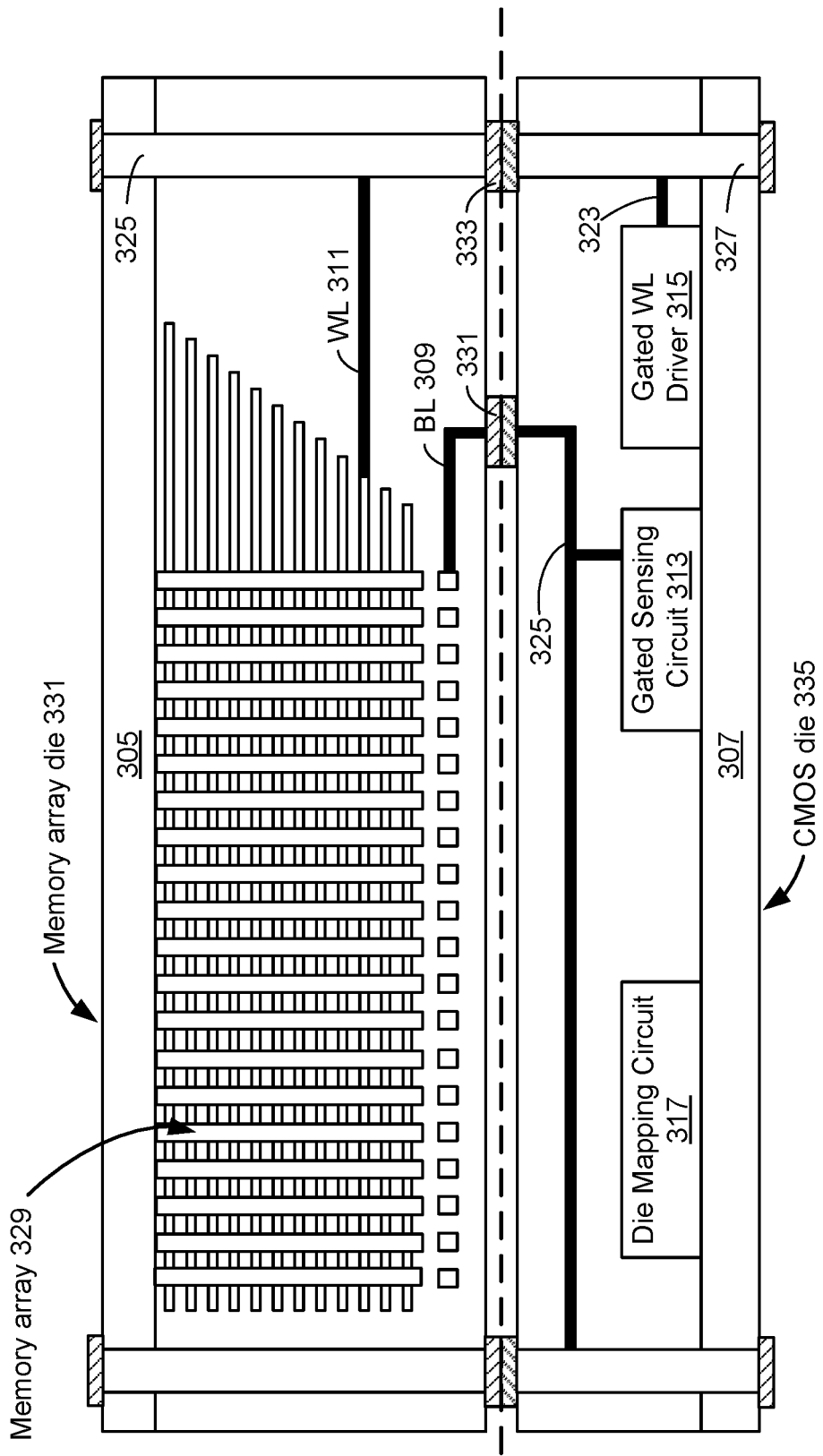
FIG. 2B depicts one embodiment of a plurality of stacked die that includes a memory array die and a CMOS die.

FIG. 2B depicts one embodiment of a plurality of stacked die that includes memory array die 331 and CMOS die 335. The memory array die 331 may correspond with the memory structure die 303 in FIG. 2A. The CMOS die 335 may correspond with the memory array support circuitry die 301 in FIG. 2A. As depicted in FIG. 2B, the memory array die 331 has been positioned above and bonded to the CMOS die 335. The memory array die 331 includes a memory array 329 comprising a plurality of memory cells. In one example, the memory array 329 may comprise a plurality of vertical NAND strings. The CMOS die 335 also includes a die mapping circuit 317 for mapping or electrically connecting one or more CMOS die within the plurality of stacked die with one or more memory array die within the plurality of stacked die. The die mapping circuit 317 may cause the gated sensing circuit 313 to be electrically connected to the bit line connection 325 or to be electrically disconnected from the bit line connection 325. The die mapping circuit 317 may cause the gated word line WL driver 315 to be electrically connected to the word line connection 323 or to be electrically disconnected from or cut off from the word line connection 323.

The CMOS die 335 also includes gated sensing circuit 313 and gated word line WL driver 315. The gated sensing circuit 313 may comprise a set of sense amplifiers (or a set of read/write circuits such as read/write circuits 328 in FIG. 2A) in series with an analog multiplexor or other gating transistors that may cut off the gated sensing circuit 313 from the bit line connection 325. As the bit line connection 325 has been connected to the bit line BL 309 of the memory array die 301 via bond pad 331, if the set of sense amplifiers within the gated sensing circuit 313 is electrically connected to the bit line connection 325, then the set of sense amplifiers may bias the bit line BL 309 connected to the memory array 329 and sense current from memory cells within the memory array 329. However, if sense amplifiers from another CMOS die not depicted are instead electrically connected to the bit line connection 325, then the gated sensing circuit 313 will prevent the set of sense amplifiers from being electrically connected to the bit line connection 325.

The gated word line WL driver 315 may comprise a set of word line drivers (or last stage row decoders) in series with an analog multiplexor or other gating transistors that may cut off or electrically disconnect the gated word line WL driver 315 from the word line connection 323. As the word line connection 323 has been connected to the word line WL 311 of the memory array 329, if the set of word line drivers within the gated word line WL driver 315 is electrically connected to the word line connection 323, then the set of word line drivers may drive or bias the word line WL 311 connected to the memory array 329. However, if word line drivers from another CMOS die not depicted are instead electrically connected to the word line WL 311 connected to the memory array 329, then the gated word line WL driver 315 will prevent the set of word line drivers within the gated word line WL driver 315 from being electrically connected to the word line connection 323. Both the word line connection 323 and the word line WL 311 connected to the memory array 329 are electrically connected to a portion of a vertical TSV bus that includes a first TSV 325 that extends through a substrate 305 of the memory array die 331 and a second TSV 327 that extends through a substrate 307 of the CMOS die 335. The portion of the vertical TSV bus may allow other die not depicted arranged above or below the memory array die 331 to electrically connect to the word line WL 311.

Figure 3A:
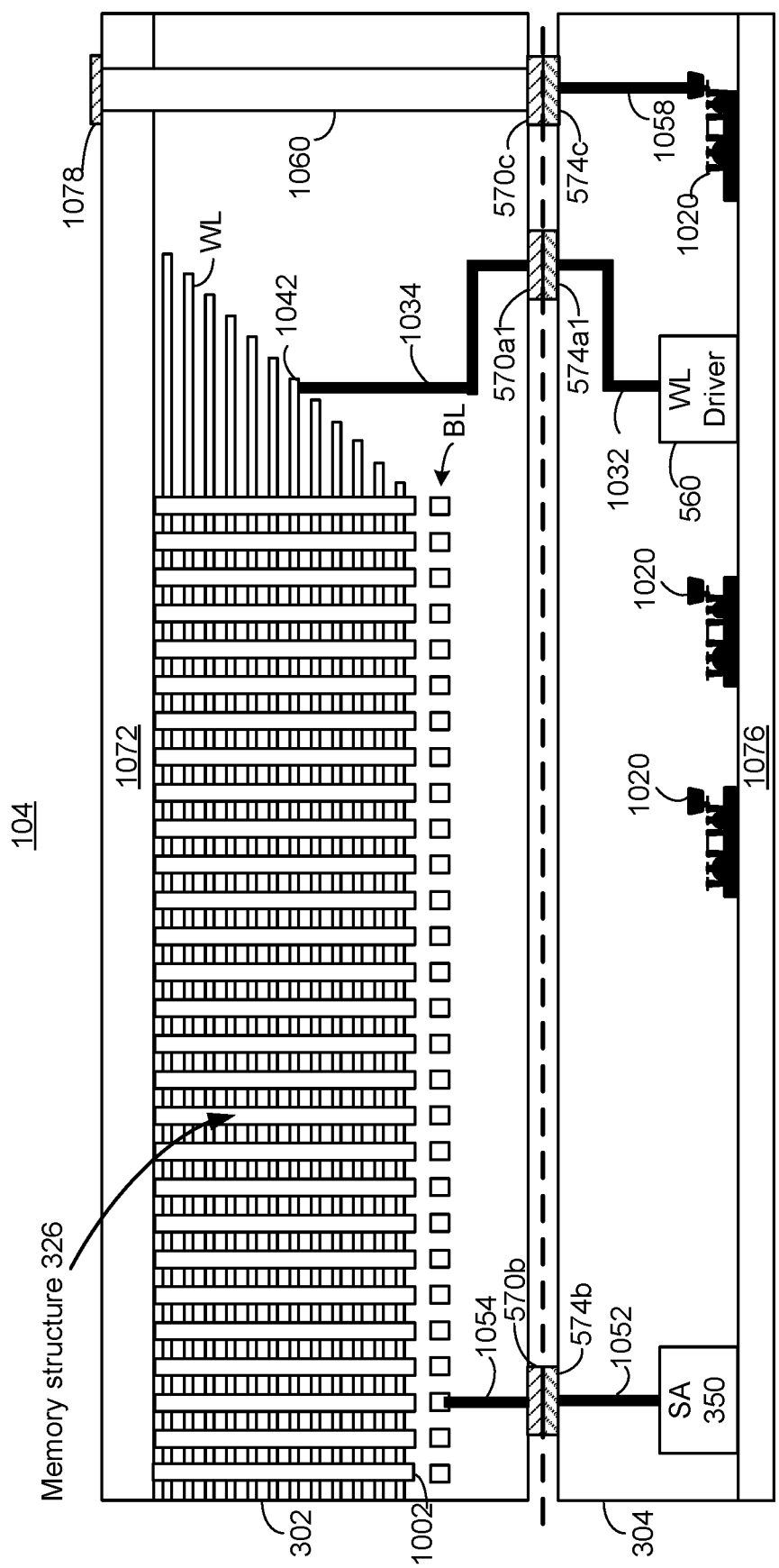
FIGS. 3A-3B depict various embodiments of an integrated memory assembly.

FIG. 3A depicts one embodiment of an integrated memory assembly 104. As depicted, the memory die 302 is bonded to control die 304. Note that although a gap is depicted between the pair of adjacent die, such a gap may be filled with an epoxy or other resin or polymer. The memory die 302 includes a memory structure 326. Memory structure 326 may be fabricated on substrate 1072 of memory die 302. The substrate 1072 may be formed from a portion of a silicon wafer, in some embodiments. The memory structure 326 may comprise a three-dimensional memory array or an array of vertical NAND strings. As depicted, the memory structure 326 may include a number of word line (WL) layers and bit line (BL) layers. The word line layers may be separated by dielectric layers. The dielectric layers are represented by gaps between the word line layers. There are a number of columns that extend through the stack of word line layers. One column 1002 is referred to in each stack with reference numeral 1002. The columns contain memory cells. For example, each column may contain a NAND string. There are a number of bit lines (BL) adjacent to the stack.

Word line driver 560 concurrently provides voltages to a word line 1042 in memory die 302. The conductive pathway from the word line driver 560 to the word line 1042 includes conductive pathway 1032, bond pad 574a1, bond pad 570a1, and conductive pathway 1034. In some embodiments, conductive pathways 1032, 1034 are referred to as a pathway pair. Conductive pathways 1032, 1034 may each include one or more vias (which may extend vertically with respect to the major surfaces of the die) and one or more metal interconnects (which may extend horizontally with respect to the major surfaces of the die). Conductive pathways 1032, 1034 may include transistors or other circuit elements. In one embodiment, the transistors may be used to, in effect, open or close the pathway. Other word line drivers (not depicted in FIG. 3A) provide voltages to other word lines. Thus, there are additional bond pad 574a, 570a in addition to bond pads 574a1, 570a1. The bond pads may be formed for example of copper, aluminum and alloys thereof.

Sense amplifier 350 is in communication with a bit line in memory die 302. The pathway from the sense amplifier 350 to the bit line includes conductive pathway 1052, bond pad 574b, bond pad 570b, and conductive pathway 1054. In some embodiments, conductive pathways 1052, 1054 are referred to as a pathway pair. Conductive pathways 1052, 1054 may include one or more vias (which may extend vertically with respect to the major surfaces of the die) and one or more metal interconnects (which may extend horizontally with respect to the major surfaces of the die). The metal interconnects may be formed of a variety of electrically conductive metals including aluminum, tungsten, and copper and the vias may be lined and/or filled with a variety of electrically conductive metals including tungsten, copper and copper alloys. Conductive pathways 1052, 1054 may include transistors or other circuit elements. In one embodiment, the transistors may be used to, in effect, open or close the pathway.

The control die 304 has a substrate 1076, which may be formed from a silicon wafer. The sense amplifiers 350, word line driver(s) 560, and other circuitry 1020 may be formed on and/or in the substrate 1076. The circuitry 1020 may include some or all of the control circuitry 310 depicted in FIG. 2A. In some embodiments, sense amplifiers 350, word line driver(s) 560, and/or other circuitry 1020 comprise CMOS circuits.

There may be an external signal path that allows circuitry on the control die 304 to communicate with an entity external to the integrated memory assembly 104, such as memory controller 102 in FIG. 1. Therefore, circuitry 1020 on the control die 304 may communicate with controller 102. The external pathway includes via 1058 in control die 304, bond pad 574c, bond pad 570c, through silicon via (TSV) 1060, and external pad 1078. The TSV 1060 extends through substrate 1072. The TSV 1060, may be formed before, during or after formation of the integrated circuits in the semiconductor die 302, 304. The TSV may be formed by etching holes through the wafers. For example, holes may be etched through substrate 1072.

Figure 3B:
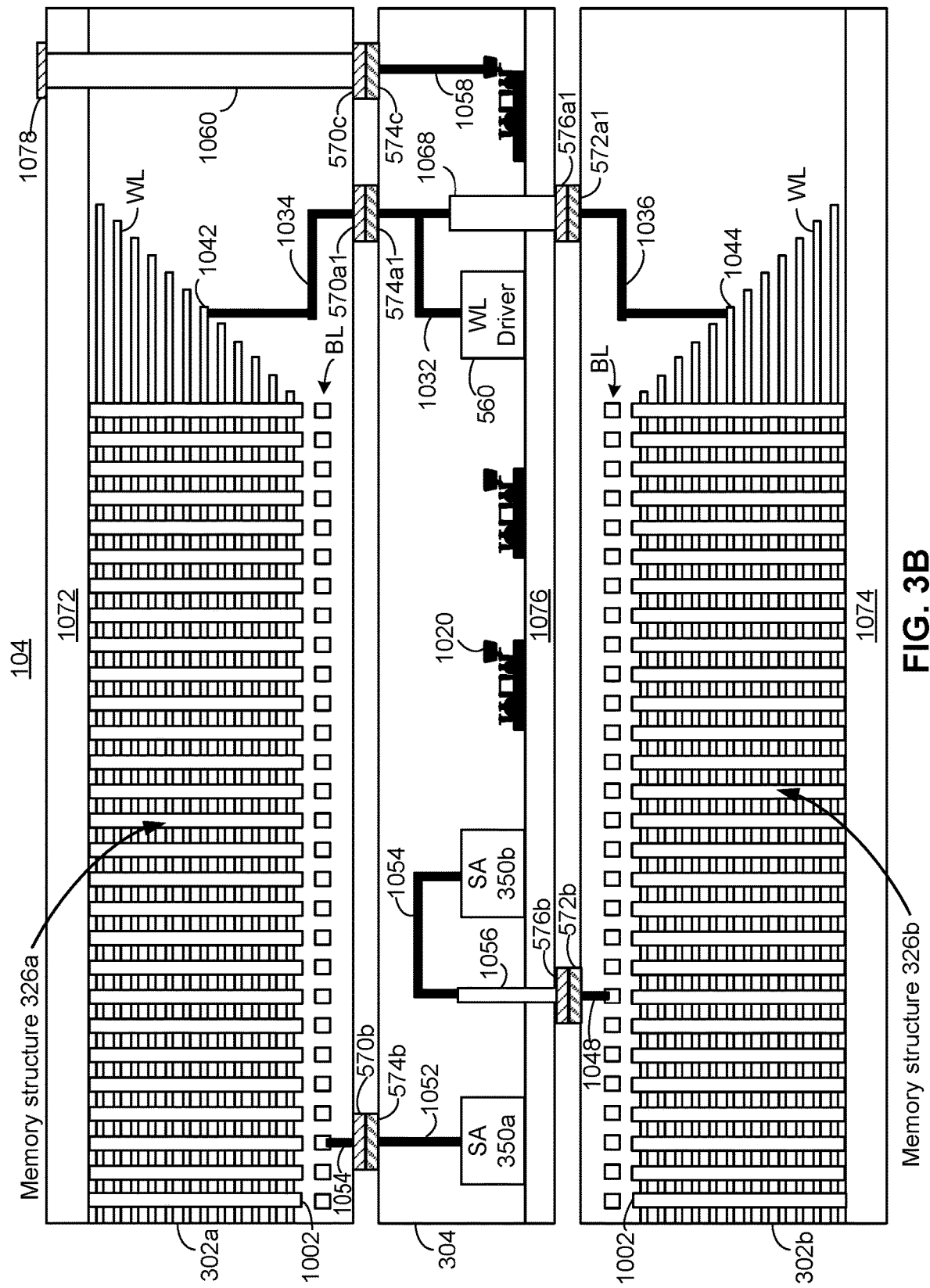

FIG. 3B depicts another embodiment of an integrated memory assembly 104. The configuration in FIG. 3B adds an extra memory die relative to the configuration depicted in FIG. 3A. Hence, similar reference numerals are used for memory die 302a in FIG. 3B as were used for memory die 302 in FIG. 3A. In one embodiment, first memory die 302a is bonded to control die 304, and control die 304 is bonded to second memory die 302b. Note that although a gap is depicted between the pairs of adjacent die, such a gap may be filled with an epoxy or other resin or polymer.

Each memory die 302a, 302b includes a memory structure 326. Memory structure 326a is adjacent to substrate 1072 of memory die 302a. Memory structure 326b is adjacent to substrate 1074 of memory die 302b. The substrates 1072, 1074 are formed from a portion of a silicon wafer, in some embodiments. In this example, the memory structures 326 each include a three-dimensional memory array.

Word line driver 560 concurrently provides voltages to a first word line 1042 in memory die 302a and a second word line 1044 in memory die 302b. The pathway from the word line driver 560 to the second word line 1044 includes conductive pathway 1032, through silicon via (TSV) 1068, bond pad 576a1, bond pad 572a1, and conductive pathway 1036. Other word line drivers (not depicted in FIG. 3B) provide voltages to other word lines.

Sense amplifier 350a is in communication with a bit line in memory die 302a. The pathway from the sense amplifier 350a to the bit line includes conductive pathway 1052, bond pad 574b, bond pad 570b, and conductive pathway 1054. Sense amplifier 350b is in communication with a bit line in memory die 302b. The pathway from the sense amplifier 350b to the bit line includes conductive pathway 1054, TSV 1056, bond pad 576b, bond pad 572b, and conductive pathway 1048. Numerous modification to an embodiment depicted in FIG. 3B are possible One modification is for sense amplifiers 350a to be located on first memory die 302a, and for sense amplifiers 350b to be located on second memory die 302b.

Figure 4:
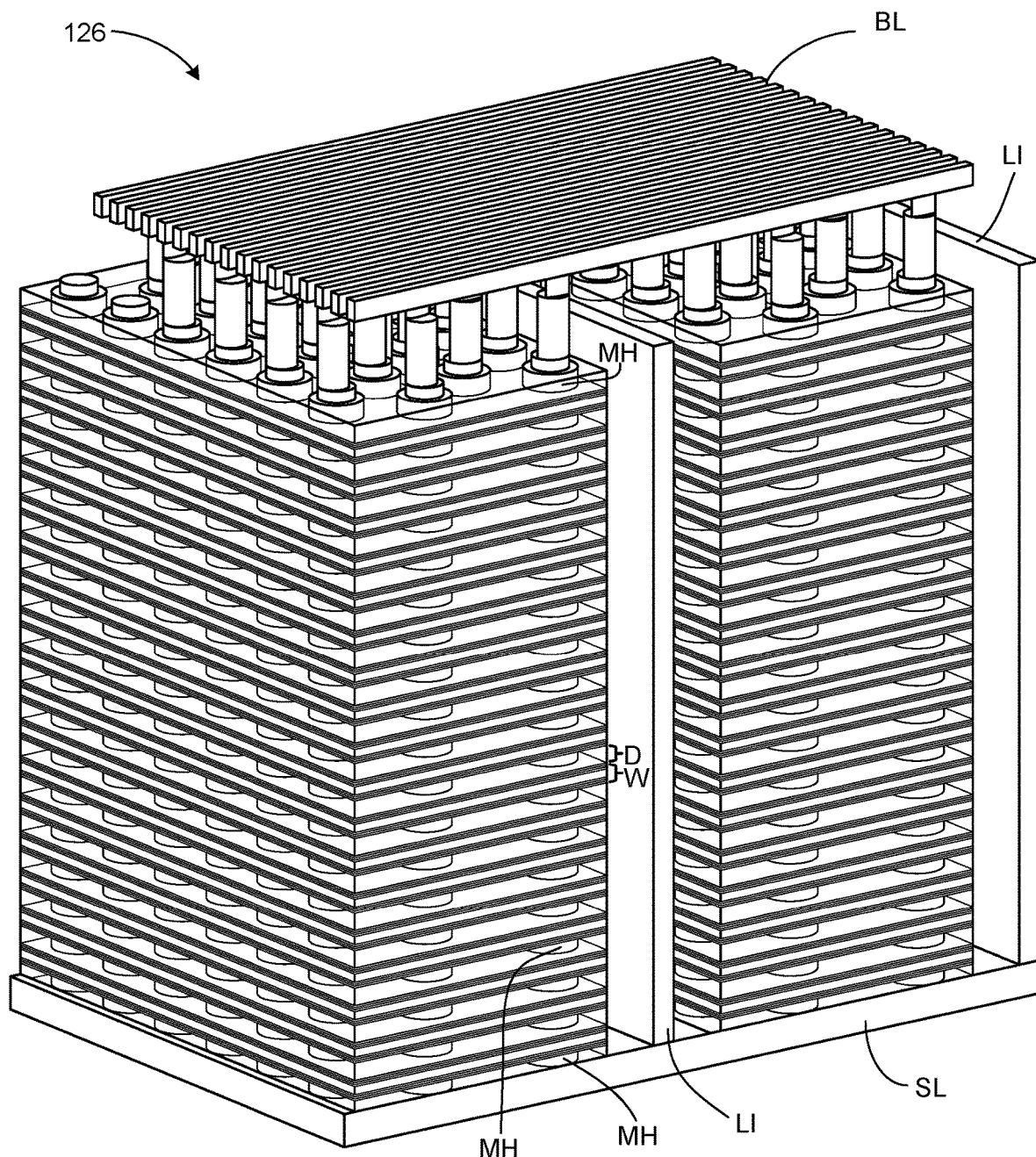
FIG. 4 is a perspective view of a portion of one embodiment of a monolithic three dimensional memory structure.

FIG. 4 is a perspective view of a portion of one example embodiment of a monolithic three dimensional memory array that can comprise memory structure 326, which includes a plurality non-volatile memory cells arranged as vertical NAND strings. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 4 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data.

The memory systems discussed herein can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed states or programmed data states. In some embodiments, data states S1-S7 can overlap, with controller 122 relying on error correction to identify the correct data being stored.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming including (but not limited to) multiple stage/phase programming.

Each threshold voltage distribution (data state) of FIG. 5 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 6A is a table describing one example of an assignment of data values to data states. In the table of FIG. 6A, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

As discussed above, it is possible that memory cells can become over programmed. For example, consider the example of a memory cell intended to be programmed to data state S4. The programming process is designed to increase the threshold voltage of the memory cell from the threshold voltage distribution for data state S0 to data S4 by applying a programming signal as a set of programming pulses that increase in magnitude by a step size and testing between program pulses as to whether the memory cell's threshold voltage has reached Vv4. However, due to a structural variation or increase in programming speed due to program/erase cycling, it is possible that when the memory cell's threshold voltage has reached Vv4 it has also surpassed Vr5, which may lead to an error when reading the memory cell later. This is one example of over programming. If a small number of memory cells become over programmed, the ECC process during reading may be able to correct the errors. However, if too many memory cells are over programmed or have errors, then the ECC may not be able to correct all of the errors and the reading process may fail, resulting in loss of data.

To prevent loss of data, it is proposed that the non-volatile storage system include a mechanism to compensate for over programming during the programming process. That is, after the programming process starts for a set of data and target memory cells and prior to the programming process completing for the set of data and the target memory cells, the system determines whether there is more than a threshold number of over programmed memory cells and, if so, then the system adjusts the programming process mid-way through the programming process (e.g., in-flight) to compensate for the over programming that has occurred so far in the currently being performed programming process.

FIG. 6B depicts one embodiment of a series of program and verify pulses which are applied to a selected word line during a programming operation. A programming operation may include multiple program-verify iterations, where each iteration applies one or more programming pulses followed by one or more verify pulses (e.g., to verify or determine the programming state or the programming level of a memory cell) to a selected word line. In one embodiment, the programming pulses are stepped up in successive iterations. Moreover, each programming pulse may include a first portion which has a pass voltage (Vpass) level, e.g., 6-8 V, followed by a second, highest amplitude portion at a programming voltage (Vpgm) level, e.g., 12-25 V. For example, as depicted in FIG. 6B, a first, second, third, and fourth programming pulses 800, 802, 804 and 806 have programming voltage levels of Vpgm1, Vpgm2, Vpgm3 and Vpgm4, respectively. One or more verify voltages 808, such as verify voltages Vva, Vvb and Vvc, may be provided after each programming pulse. In some cases, one or more initial programming pulses are not followed by verify pulses because it is not expected that any storage elements could have reached the lowest program state (e.g., A-state). Subsequently, in some cases, programming iterations may use verify pulses for the A-state, followed by programming iterations which use verify pulses for the A-states and B-states, followed by programming iterations which use verify pulses for the B-states and C-states.

Figure 7:
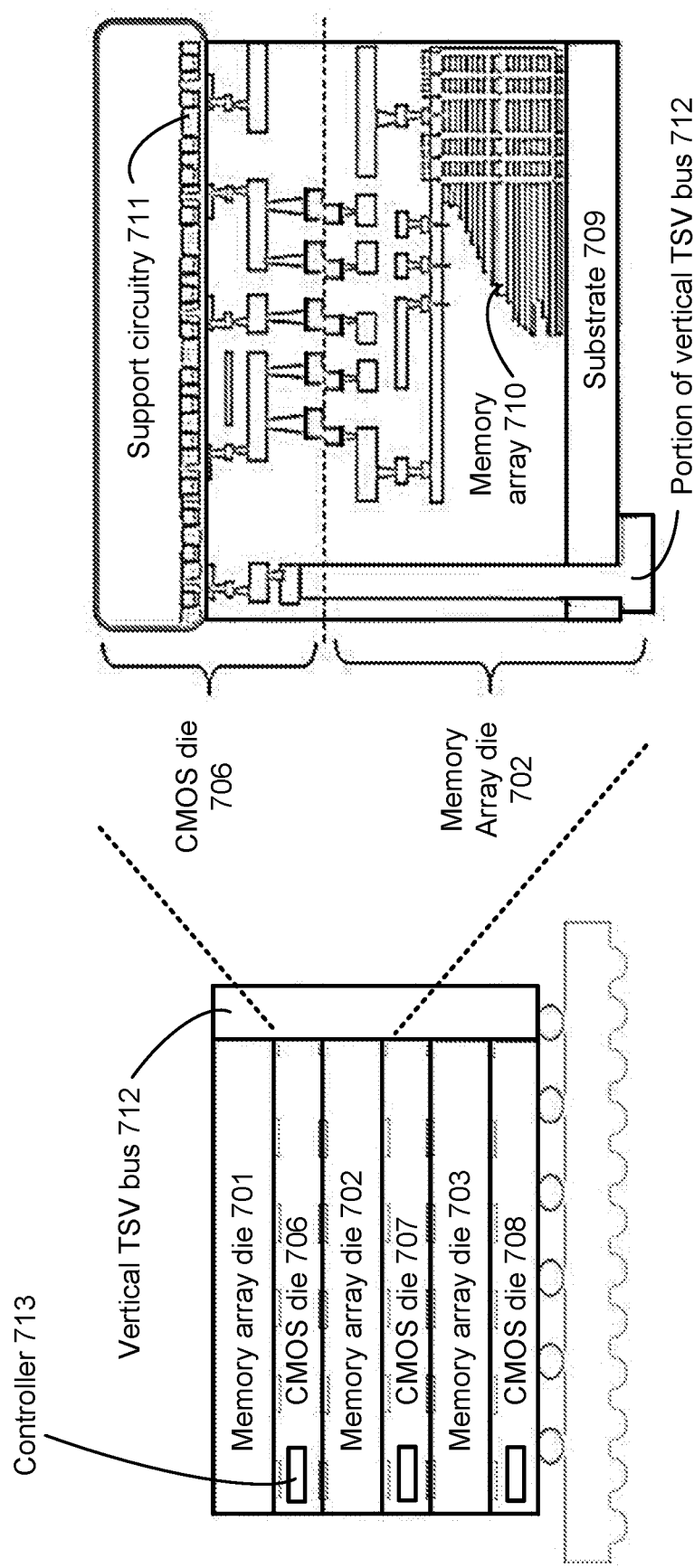
FIG. 7 depicts one embodiment of a plurality of stacked die.

FIG. 7 depicts one embodiment of a plurality of stacked die. As depicted, the plurality of stacked die includes memory array die 701-703 and CMOS die 706-708 interdigitated in a vertical stack. The CMOS die 706-708 may include CMOS circuitry for controlling various memory operations performed using the memory array die 701-703. The CMOS die 706 includes a controller 713, which may comprise a die mapping controller for assigning one or more CMOS die within the plurality of stacked die to one or more of the memory array die within the plurality of stacked die. In one example, the controller 713 may correspond with die mapping circuit 317 in FIG. 2B. Each die of the plurality of stacked die may be in communication with the other die of the plurality of stacked die via a vertical TSV bus 712. The vertical TSV bus 712 may comprise configurable electrical connections that span the length of the stacked die and may include through-silicon vias through each of the memory array die 701-703. The configurable electrical connections may utilize a crossbar structure or transistor-based multiplexors.

The CMOS die 706 may be flipped such that its substrate is positioned above the interconnect layers for the CMOS die 706 and then positioned above and connected to the memory array die 702. Some of the memory array die and CMOS die may utilize a flip chip pairing with the active elements of the support circuitry 711 positioned above the interconnections for the CMOS die 706 and the memory array 710 (e.g., comprising vertical NAND strings) positioned above the substrate 709 for the memory array die 702. An electrical connection comprising a portion of the vertical TSV bus 712 may extend from the CMOS die 706 through the substrate 709 of the memory array die 702 using a TSV. The portion of the vertical TSV bus 712 may connect to support circuitry for the CMOS die 707, which may then extend from the CMOS die 707 through the substrate of the memory array die 703 using another TSV. Although the vertical TSV bus 712 is depicted as extending along one side of the plurality of stacked die, other vertical TSV busses or electrical connections may extend through a middle portion of the stacked die.

The support circuitry 711 may comprise sense amplifiers and data latches for storing data read from the memory array 710. The support circuitry 711 may also include voltage regulators for generating voltages to be applied to the data latches over time. For example, the support circuitry 711 may generate a bulk voltage (e.g., 0V or −1V) to be applied to the PWELL bodies of low VT NMOS transistors within the data latches as well as a source voltage (e.g., 0.7V or 0V) to be applied to the sources of the low VT NMOS transistors within the data latches. An analog multiplexor may be used to select between the various regulated voltage levels such that 0V is applied to the sources of the low VT NMOS transistors within the data latches when new data is being latched and 0.7V is applied to the sources of the low VT NMOS transistors after the new data has been latched.

Figure 8A:
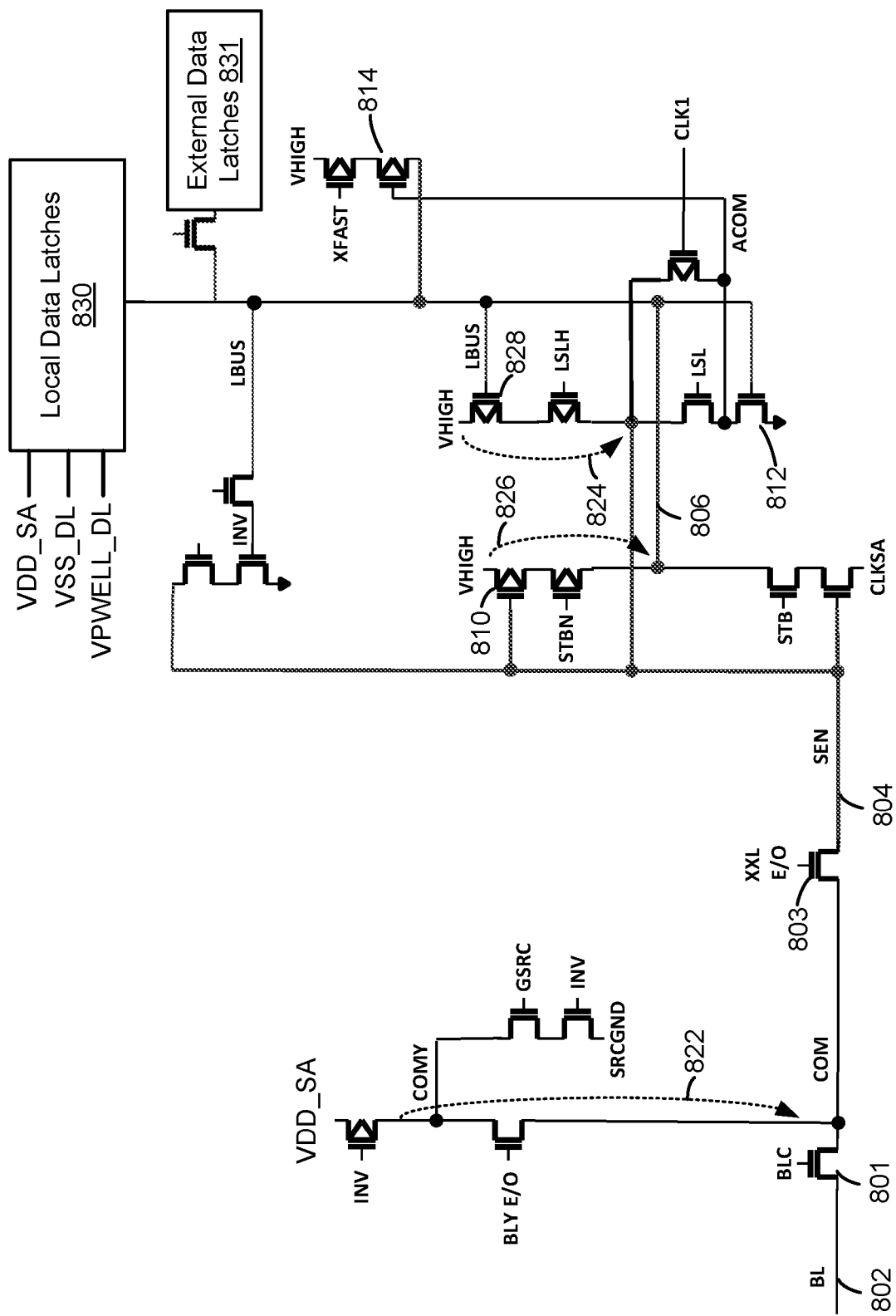
FIG. 8A depicts one embodiment of a portion of a sense amplifier.

FIG. 8A depicts one embodiment of a portion of a sense amplifier. The sense amplifier (or sense amplifier circuit) may comprise part of the support circuitry 711 depicted in FIG. 7. As depicted, the portion of the sense amplifier includes a bit line BL 802 connected at the source side of an NMOS transistor 801 with a gate controlled by BLC. During a sensing operation, the NMOS transistor 801 may be set into a source follower configuration in which the bit line is biased to a bit line voltage via application of the appropriate voltage to BLC (e.g., setting BLC to roughly an NMOS transistor threshold voltage above the bit line voltage). The NMOS transistor threshold voltage may be elevated due to the body effect. The precharge path for precharging the bit line BL 802 may be via precharge path 822.

Prior to sensing current drawn from the bit line BL 802 during the sensing operation, the bit line BL 802 may be precharged to a first voltage VDD_SA (e.g., 2V or 1.5V) and the sensing node SEN 804 that is electrically coupled to the bit line BL 802 may be precharged to a second voltage VHIGH that is greater than the first voltage (e.g., 4V) via a precharge path 824 for precharging the sensing node. During the sensing operation, as charge is drawn from the sensing node, the voltage at the sensing node may reduce or drop from the second voltage. As the voltage of the sensing node SEN 804 drops, the voltage of the feedback node LBUS 806 may increase via the sensing path 826 as PMOS transistor 810 turns on or is set into a conducting state.

In one embodiment, if the sensing node SEN 804 drops more than a PMOS transistor threshold voltage below the second voltage VHIGH, then the feedback node LBUS 806 may be charged up via the sensing path 826. As the voltage of the feedback node LBUS 806 is increased, the NMOS transistor 812 may be turned on or set into a conducting state causing the PMOS transistor 814 to be turned on or set into a conducting state. As the drain of the PMOS transistor 814 is connected to the feedback node LBUS 806, the active pull-up via the PMOS transistor 814 may quickly raise the voltage of the feedback node LBUS 806 to the second voltage VHIGH. Once the feedback node LBUS 806 has been pulled up to the second voltage, the precharge path 824 for precharging the sensing node SEN 804 may be disabled as the PMOS transistor 828 has been turned off or set into a non-conducting state. If the feedback node LBUS 806 has not been charged up to a voltage sufficient to turn off the PMOS transistor 828, then the sensing node SEN 804 will be precharged during a subsequent precharge phase for a subsequent sensing operation via the precharge path 824.

The local data latches 830 may comprise one or more data latches for storing data from the feedback node LBUS 806. The local data latches 830 may be located within the sense amplifier circuit and may store multiple data bits corresponding with the data state of a multi-level memory cell. The external data latches 831 may comprise data latches located outside of the sense amplifier circuit. Various logical operations (e.g., AND and OR operations) may be performed using data stored within the local data latches 830 and the external data latches 831. Stored data may also be transferred from the local data latches 830 to the external data latches 831.

The voltages for powering the data latches VDD_SA (e.g., the power supply voltage for the sense amplifier), VSS_DL (e.g., the source connection for NMOS transistors within the data latches), and VWELL_DL (e.g., the PWELL connection for NMOS transistors within the data latches) may be generated using voltage regulators and analog multiplexors to select the appropriate voltages. In one example, during sensing of memory cell current from the bit line BL 802, VDD_SA may be set to 1.5V, VSS_DL may be set to 0V, and VWELL_DL may be set to 0V. After new data has been latched by the local data latches 830, the voltage applied to VSS_DL may be increased from 0V to 0.7V and/or the voltage applied to VWELL_DL may be reduced from 0V to −0.7V in order to reduce parasitic currents flowing from VDD_SA. In some embodiments, each of the data latches of the local data latches 830 receives the same VSS_DL and VPWELL_DL voltage levels.

Figure 8B:
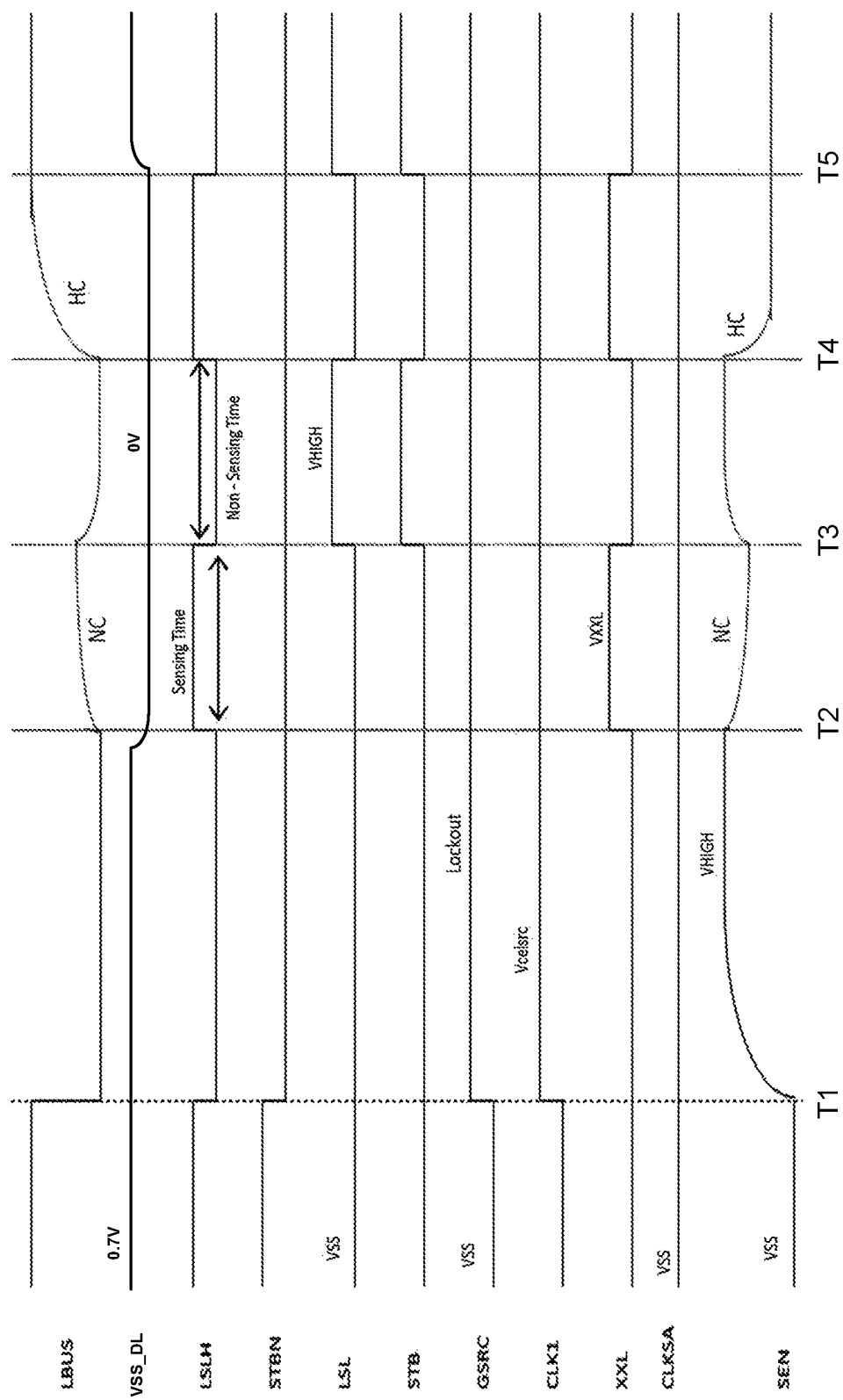
FIG. 8B depicts one embodiment of voltage waveforms corresponding with operation of the portion of the sense amplifier depicted in FIG. 8A.

FIG. 8B depicts one embodiment of voltage waveforms corresponding with operation of the portion of the sense amplifier depicted in FIG. 8A. As depicted, at time T1, LBUS and LSLH transition from a high voltage (e.g., VHIGH) to a low voltage (e.g., 0V) causing the sensing node SEN to be precharged to VHIGH via the precharge path 824. The ACOM node that drives the gate of the PMOS transistor 814 is also set to VHIGH. Prior to time T2, the voltage VSS_DL applied to the sources of low VT NMOS transistors within data latches of the sense amplifier transitions from 0.7V to 0V. At time T2, LSLH transitions from the low voltage to the high voltage cutting off the precharge path 824 and the NMOS transistor 803 is set into a conducting state such that the sensing node SEN 804 is electrically coupled or connected to the bit line BL 802.

As depicted, between times T2 and T3, a first sensing operation is performed in which the word line voltage applied to a memory cell connected to the bit line BL 802 is not sufficient to set the memory cell into a highly conducting state (HC) and instead the memory cell remains in a non-conducting state (NC). Due to charge leakage from the sensing node (e.g., due to parasitic leakage currents), the voltage of the sensing node may drop slightly; however, as the feedback node LBUS 806 has not been pulled up sufficiently to cut off the PMOS transistor 828, the precharge path 824 will be enabled once LSLH falls. At time T3, LSLH falls causing the precharge path 824 to charge up the sensing node SEN 804 up to VHIGH and STB rises causing the feedback node LBUS to fall to VSS or 0V.

At time T4, LSLH transitions from the low voltage to the high voltage cutting off the precharge path 824 and the NMOS transistor 803 is set into a conducting state such that the sensing node SEN 804 is electrically coupled or connected to the bit line BL 802. In this case, between times T4 and T5, a second sensing operation is performed in which the word line voltage applied to the memory cell is sufficient to set the memory cell into a conducting state or a highly conducting state (HC) causing the voltage of the sensing node SEN 804 to fall and the voltage of the feedback node LBUS 806 to be pulled up via the sensing path 826. In the case that XFAST is low enabling the feedback circuit comprising PMOS transistor 814 and NMOS transistor 812, once LBUS is charged up to the threshold voltage of the NMOS transistor 812, the gate of the PMOS transistor 814 will be pulled to ground causing the PMOS transistor 814 to pull up the feedback node LBUS 806 to VHIGH. This active pull up on the feedback node LBUS 806 caused by the configuration of PMOS transistor 814 and NMOS transistor 812 allows the precharge path 824 to be quickly disabled and also reduces the memory cell state data dependence on the precharge time of the sensing node via the precharge path 824 during subsequent sensing operations. At time T5, LSLH falls, but the sensing node SEN 804 is not charged up to VHIGH as the feedback node LBUS 806 has been pulled up to VHIGH setting PMOS transistor 828 into a non-conducting state and cutting off the precharge path 824. After time T5, the voltage VSS_DL applied to the sources of low VT NMOS transistors within the data latches transitions from 0V back to 0.7V. The increase in the voltage VSS_DL applied to the sources of the low VT NMOS transistors within the data latches increases the threshold voltages of the low VT NMOS transistors due to an increase in their body effect.

Figure 8C:
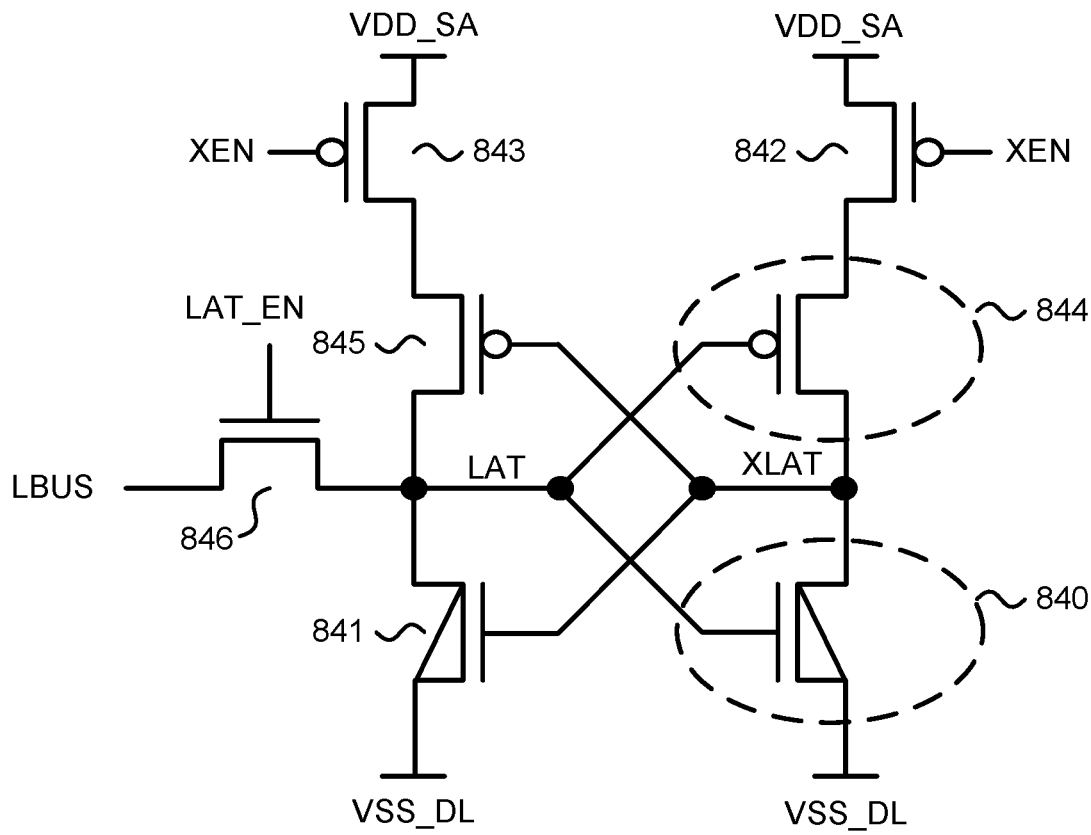
FIG. 8C depicts one embodiment of a data latch.

FIG. 8C depicts one embodiment of a data latch, such as one of the local data latches 830 in FIG. 8A. The data latch includes a pair of cross-coupled inverters and a latching transistor 846 controlled by a latch enable signal LAT_EN. The first inverter comprises PMOS transistor 845 and low VT NMOS transistor 841 with their gates controlled by node XLAT. The second inverter comprises PMOS transistor 844 and low VT NMOS transistor 840 with their gates controlled by node LAT. The latching transistor 846 comprises an NMOS transistor with its gate controlled by the latch enable signal LAT_EN. When the latching transistor 846 is set into a conducting state, the voltage of the feedback node LBUS is transferred to the node LAT. The enabling transistors for the data latch comprise PMOS transistors 842-843. When the data latch is set into a disabled state, then the PMOS transistors 842-843 are set into a non-conducting state in order to minimize parasitic current drawn from the supply voltage VDD_SA.

As depicted, when the data latch is set into an enabled state with XEN set to 0V, a parasitic current path may exist through one of the low VT NMOS transistors 840-841 that is set into a non-conducting state. In one example, the threshold voltage of the low VT NMOS transistor 840 may comprise 300 mV. The use of low VT NMOS transistors 840-841 may allow the data latch to operate with a reduced supply voltage VDD_SA at the expense of increased subthreshold current.

Figure 8D:
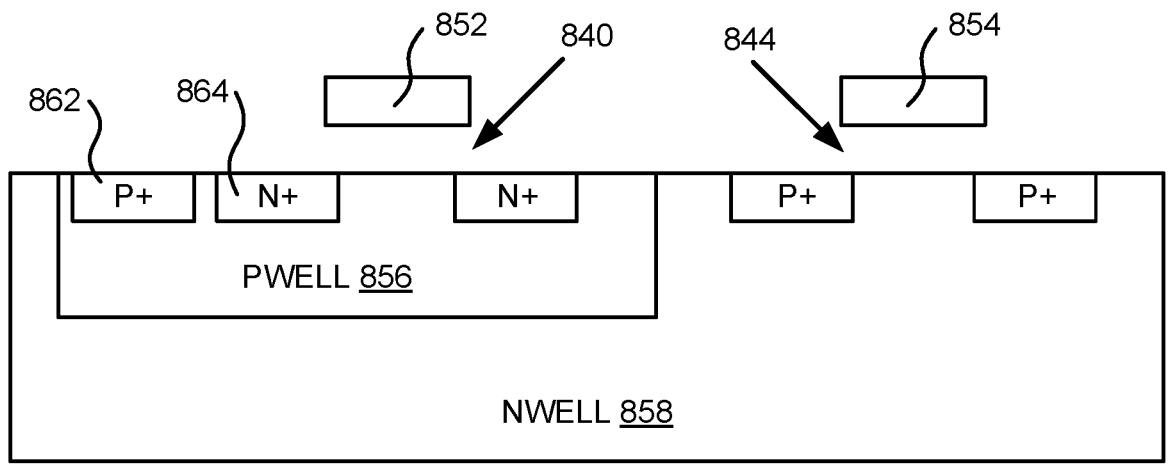
FIGS. 8D-8I depict various embodiment of cross-sectional views of low VT NMOS transistors depicted in FIG. 8C.

FIG. 8D depicts one embodiment of a cross-sectional view of the low VT NMOS transistors 840 and 844 depicted in FIG. 8C. The low VT NMOS transistor 840 includes a gate 852, an N+ source diffusion 864 within PWELL 856, and a PWELL contact 862. The PMOS transistor 844 includes a gate 854 and P+ source/drain diffusions within NWELL 858.

Figure 8E:
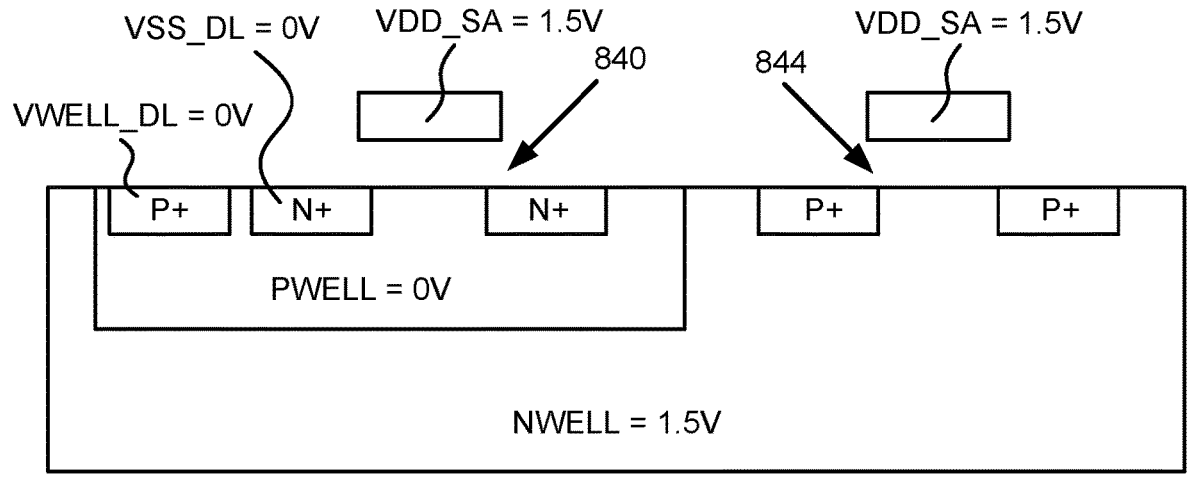

FIG. 8E depicts one embodiment of the cross-sectional view of the low VT NMOS transistors depicted in FIG. 8D in which the gates 852 and 854 of the low VT NMOS transistors 840 and 844 are set to 1.5V, the N+ source diffusion 864 is set to 0V, and the PWELL 856 is set to 0V via PWELL contact 862. In this case, the source to bulk voltage of the low VT NMOS transistor 840 is 0V and the latch node LAT may store a voltage of 1.5V corresponding with a logic "1."

Figure 8F:
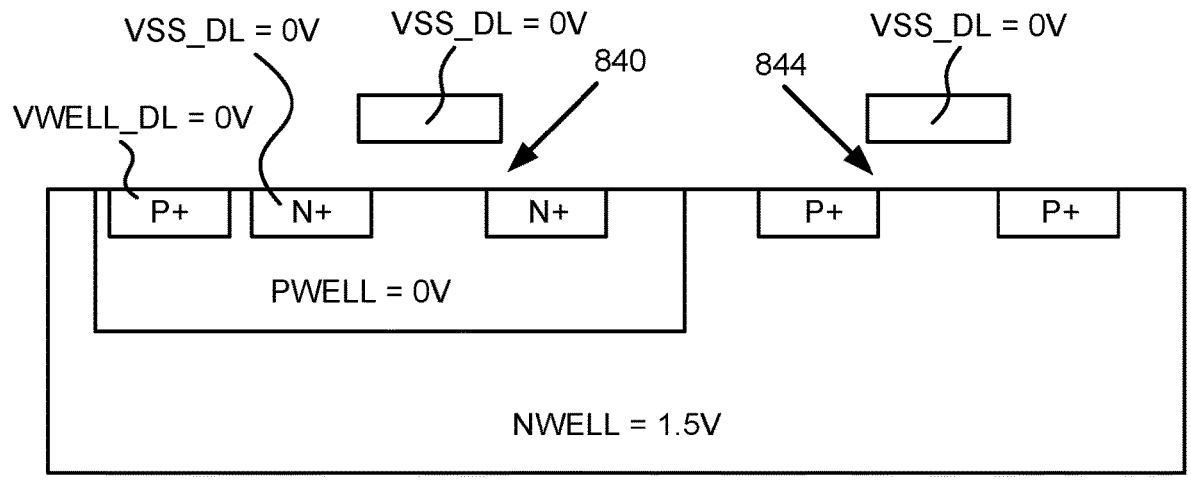

FIG. 8F depicts one embodiment of the cross-sectional view of the low VT NMOS transistors depicted in FIG. 8D in which the gates 852 and 854 of the low VT NMOS transistors 840 and 844 are set to 0V, the N+ source diffusion 864 is set to 0V, and the PWELL 856 is set to 0V via PWELL contact 862. In this case, the source to bulk voltage of the low VT NMOS transistor 840 is 0V and the latch node LAT may store a voltage of 0V corresponding with a logic "0."

Figure 8G:
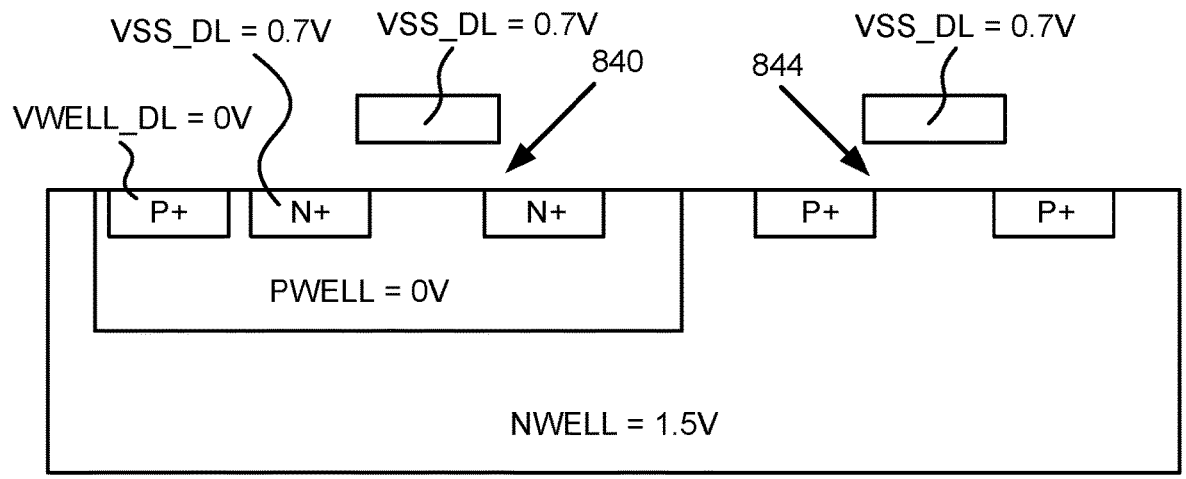

FIG. 8G depicts one embodiment of the cross-sectional view of the low VT NMOS transistors depicted in FIG. 8D in which the gates 852 and 854 of the low VT NMOS transistors 840 and 844 are set to 0.7V, the N+ source diffusion 864 is set to 0.7V, and the PWELL 856 is set to 0V via PWELL contact 862. In this case, the source to bulk voltage of the low VT NMOS transistor 840 is 0.7V, which increases the threshold voltage of the low VT NMOS transistor 840 and reduces subthreshold currents. The gates 852 and 854 of the low VT NMOS transistors 840 and 844 may be set to 0.7V and not a lower voltage value as the pull-down path from the latch node LAT in FIG. 8C is to VSS_DL, which is set to 0.7V.

Figure 8H:
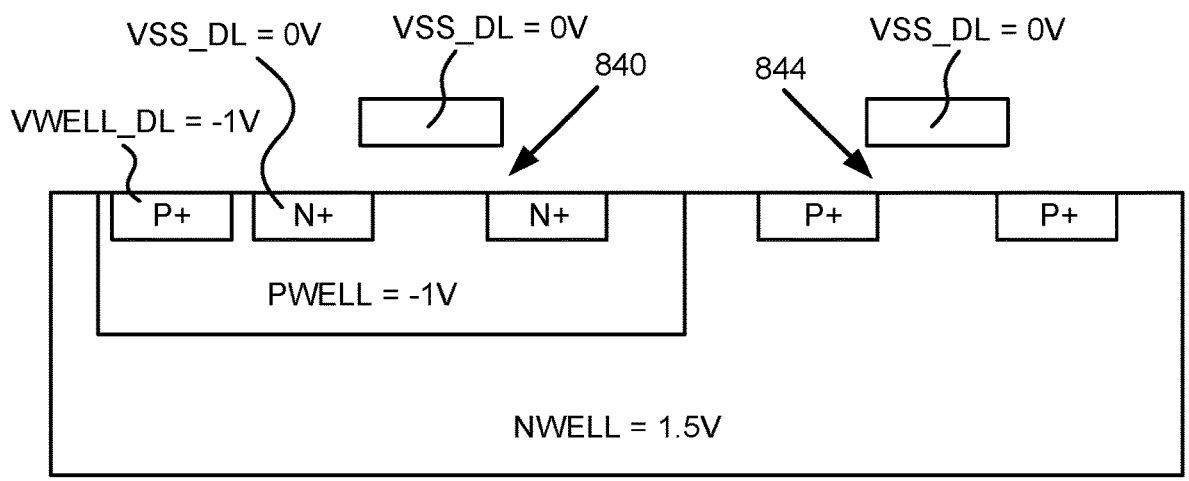

FIG. 8H depicts one embodiment of the cross-sectional view of the low VT NMOS transistors depicted in FIG. 8D in which the gates 852 and 854 of the low VT NMOS transistors 840 and 844 are set to 0V, the N+ source diffusion 864 is set to 0V, and the PWELL 856 is set to −1V via PWELL contact 862. In this case, the source to bulk voltage of the low VT NMOS transistor 840 is 1V, which increases the threshold voltage of the low VT NMOS transistor 840 and reduces subthreshold currents.

Figure 8I:
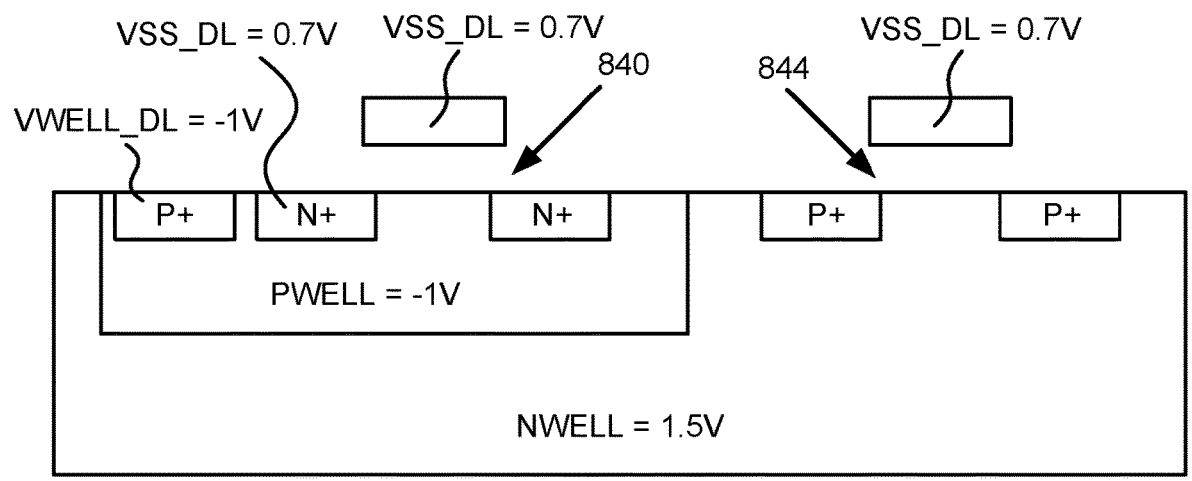

FIG. 8I depicts one embodiment of the cross-sectional view of the low VT NMOS transistors depicted in FIG. 8D in which the gates 852 and 854 of the low VT NMOS transistors 840 and 844 are set to 0.7V, the N+ source diffusion 864 is set to 0.7V, and the PWELL 856 is set to −1V via PWELL contact 862. In this case, the source to bulk voltage of the low VT NMOS transistor 840 is 1.7V, which increases the threshold voltage of the low VT NMOS transistor 840 and reduces subthreshold currents.

In one embodiment, during the latching of new data, the data transfer time of data between data latches, the performance of logical operations between data in multiple data latches, and the performance of the data latch depicted in FIG. 8C may be improved by minimizing or eliminating the body effect for the low VT NMOS transistor 840 by setting the N+ source diffusion 864 to 0V and the PWELL 856 to 0V. After the new data has been latched, the parasitic current may be minimized by either setting the N+ source diffusion 864 to 0.7V and/or setting the PWELL 856 to −1V.

Figure 8J:
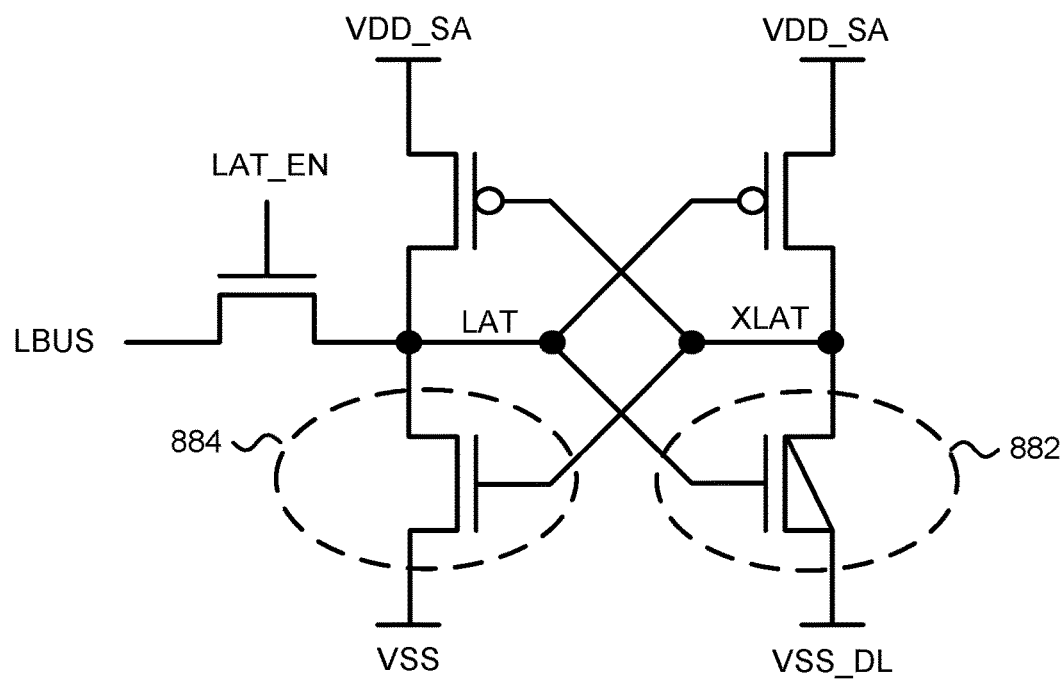
FIG. 8J depicts an alternative embodiment of a data latch.

FIG. 8J depicts an alternative embodiment of a data latch, such as one of the local data latches 830 in FIG. 8A. The data latch includes a pair of cross-coupled inverters and a latching transistor controlled by a latch enable signal LAT_EN. The PMOS transistors of the cross-coupled inverters may comprise high VT PMOS transistors. As depicted, the NMOS transistor 884 comprises a high VT NMOS transistor (e.g., with a threshold voltage of 0.7V) and the NMOS transistor 882 comprises a low VT NMOS transistor (e.g., with a threshold voltage of 0.3V). The source of the high VT NMOS transistor 884 is set to VSS or 0V and the source of the low VT NMOS transistor 882 is set to VSS_DL, which may be set to either 0V or 0.7V. The gate of the low VT NMOS transistor 882 is connected to the latch node LAT, which latches data transferred from the LBUS node on the falling edge of the latch enable signal LAT_EN. One benefit of minimizing the number of low VT NMOS transistors within the data latch is that parasitic currents may be reduced.

Figure 9A:
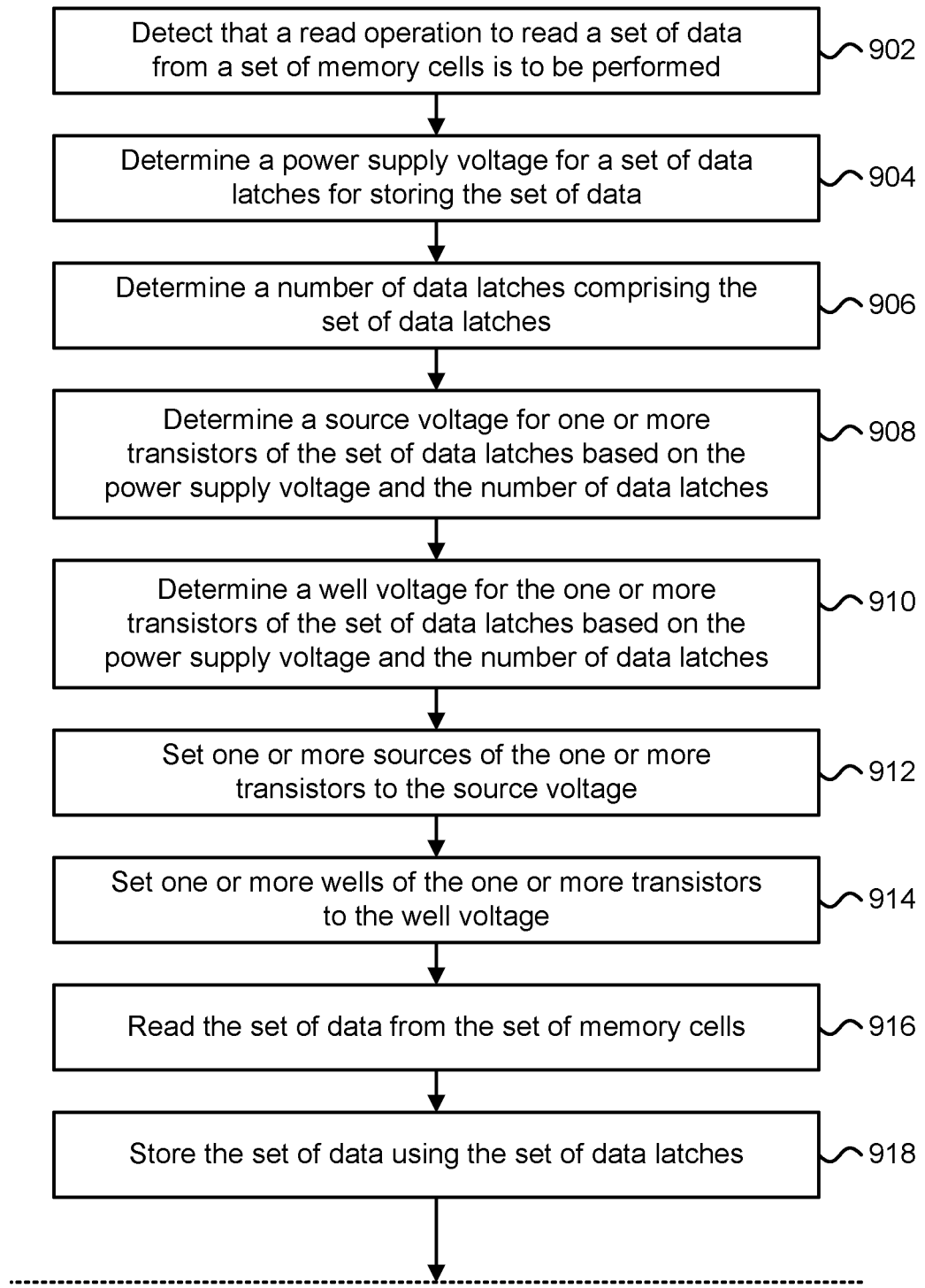
FIGS. 9A-9B depict a flowchart describing one embodiment of a process for dynamically adjusting the body effect of data latch transistors within sense amplifier circuits during sensing operations.
Figure 9B:
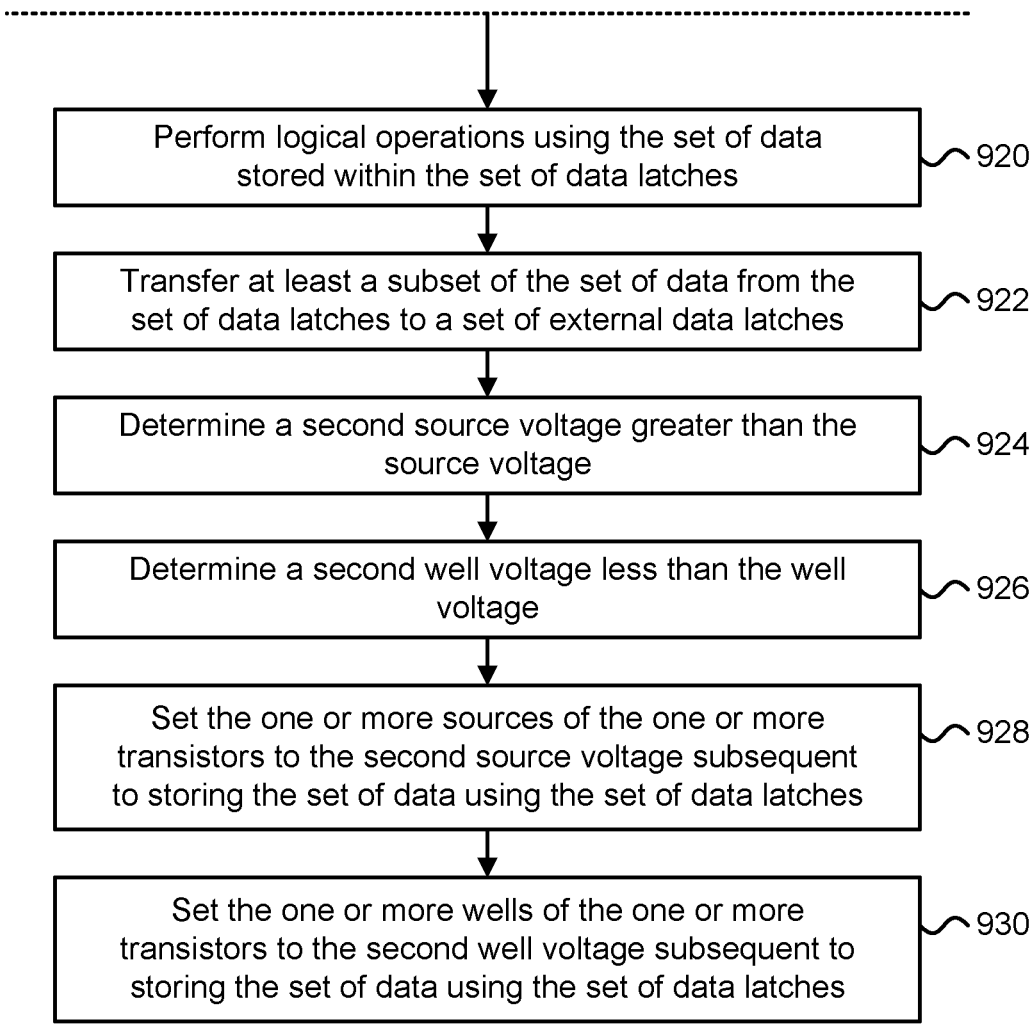

FIGS. 9A-9B depict a flowchart describing one embodiment of a process for dynamically adjusting the body effect of data latch transistors within sense amplifier circuits during sensing operations. The sensing operations may comprise memory cell sensing operations, such as a read operation or a program verify operation. In one embodiment, the process of FIGS. 9A-9B may be performed by control circuitry, such as control circuitry 310 depicted in FIG. 2A, and/or sensing circuitry, such as read/write circuits 328 in FIG. 2A. The process of FIGS. 9A-9B may also be performed using memory array support circuitry, such as support circuitry 711 in FIG. 7.

In step 902, it is detected that a read operation to read a set of data from a set of memory cells is to be performed. The set of memory cells may comprise memory cell transistors. The set of memory cells may comprise NAND string memory cells, floating-gate transistors, or charge trap transistors. In one example, it may be detected that the read operation is to be performed in response to acquiring an instruction to read one or more pages of data from a memory array, such as memory array 710 in FIG. 7. In step 904, a power supply voltage for a set of data latches for storing the set of data is determined. In one example, the power supply voltage may correspond with the supply voltage VDD_SA for the sense amplifier depicted in FIG. 8A. In some cases, if at least a threshold number of memory cells are to be accessed during the read operation or a low power mode of operation has been enabled, then the power supply voltage may be set to 1.5V; otherwise, the power supply voltage may be set to 1.8V.

In step 906, a number of data latches comprising the set of data latches is determined. The number of data latches may depend on the number of memory arrays enabled during the read operation. In step 908, a source voltage for one or more transistors of the set of data latches is determined based on the power supply voltage and the number of data latches. In one example, the set of data latches may correspond with the local data latches 830 in FIG. 8A for each of the sense amplifiers used during the read operation. The source voltage for the one or more transistors may correspond with the voltage applied to the N+ diffusion 864 in FIG. 8D.

In one embodiment, if the number of data latches is greater than a threshold number of data latches (e.g., is greater than 32K data latches), then the source voltage for the one or more transistors of the set of data latches may be set to 0.7V in order to increase the body effect of the one or more transistors; however, if the number of data latches is not greater than the threshold number of data latches, then the source voltage for the one or more transistors of the set of data latches may be set to 0V. In another embodiment, if the power supply voltage is less than a particular voltage (e.g., is less than 1.6V), then the source voltage for the one or more transistors of the set of data latches may be set to 0.7V in order to increase the body effect of the one or more transistors; however, if the power supply voltage is not less than the particular voltage, then the source voltage for the one or more transistors may be set to 0V.

In step 910, a well voltage for the one or more transistors of the set of data latches is determined based on the power supply voltage and the number of data latches. The well voltage for the one or more transistors may correspond with the voltage applied to the PWELL 856 in FIG. 8D via PWELL contact 862. In one embodiment, if the number of data latches is greater than a threshold number of data latches (e.g., is greater than 64K data latches), then the well voltage for the one or more transistors of the set of data latches may be set to negative 1V; however, if the number of data latches is not greater than the threshold number of data latches, then the well voltage for the one or more transistors of the set of data latches may be set to 0V. In another embodiment, if the power supply voltage for the set of data latches is less than a particular voltage (e.g., is less than 1.6V), then the well voltage for the one or more transistors of the set of data latches may be set to negative 1V; however, if the power supply voltage for the set of data latches is not less than the particular voltage, then the well voltage for the one or more transistors of the set of data latches may be set to 0V.

In step 912, one or more sources of the one or more transistors are set to the source voltage. In one example, the one or more sources may correspond with the N+ diffusion 864 in FIG. 8D and the one or more transistors may correspond with the low VT NMOS transistor 840 in FIG. 8D. The one or more sources may be set to 0.7V if either the number of data latches is greater than the threshold number of data latches or the power supply voltage is less than the particular voltage (e.g., is less than 1.6V). In step 914, one or more wells of the one or more transistors are set to the well voltage. In one example, the one or more wells may correspond with PWELL 856 in FIG. 8D and the one or more transistors may correspond with the low VT NMOS transistor 840 in FIG. 8D.

In step 916, the set of data is read from the set of memory cells. The set of data may be read from the set of memory cells using a sense amplifier, such as the sense amplifier depicted in FIG. 8A. In step 918, the set of data is stored using the set of data latches. The set of data latches may correspond with the local data latches 830 in FIG. 8A. In step 920, logical operations may be performed using the set of data stored within the set of data latches. In one example, a combination of logical AND and OR operations may be performed. In step 922, at least a subset of the set of data may be transferred from the set of data latches, such as the local data latches 830 in FIG. 8A, to a set of external data latches, such as the external data latches 831 in FIG. 8A. In step 924, a second source voltage greater than the source voltage is determined. In step 926, a second well voltage less than the well voltage is determined. In step 928, the one or more sources of the one or more transistors are set to the second source voltage subsequent to storing the set of data using the set of data latches. In step 930, the one or more wells of the one or more transistors are set to the second well voltage subsequent to storing the set of data using the set of data latches.

Figure 9C:
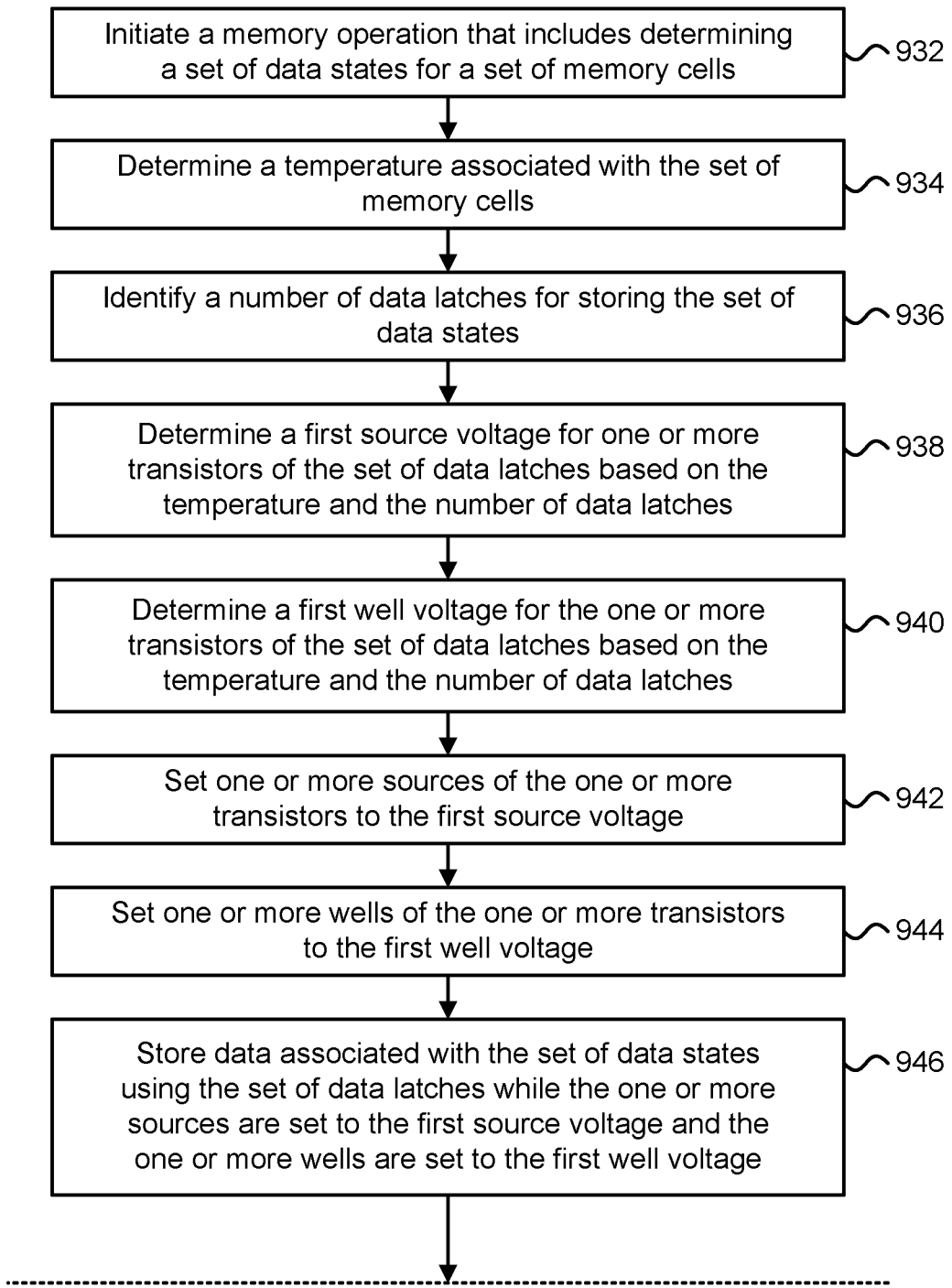
FIGS. 9C-9D depict a flowchart describing an alternative embodiment of a process for dynamically adjusting the body effect of data latch transistors within sense amplifier circuits during sensing operations.
Figure 9D:
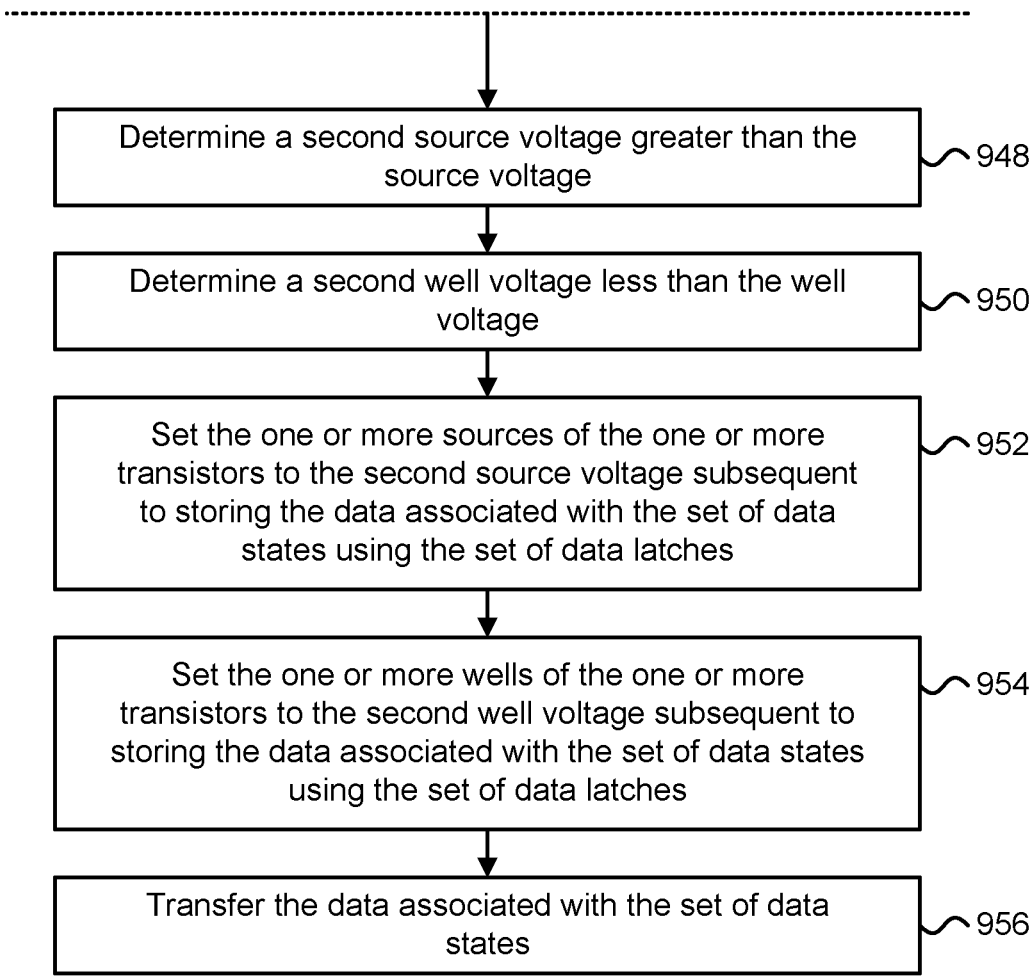

FIGS. 9C-9D depict a flowchart describing an alternative embodiment of a process for dynamically adjusting the body effect of data latch transistors within sense amplifier circuits during sensing operations. In one embodiment, the process of FIGS. 9C-9D may be performed by control circuitry, such as control circuitry 310 depicted in FIG. 2A, and/or sensing circuitry, such as read/write circuits 328 in FIG. 2A. The process of FIGS. 9C-9D may also be performed using support circuitry, such as support circuitry 711 in FIG. 7.

In step 932, a memory operation that includes determining a set of data states for a set of memory cells is initiated. The memory operation may comprise a read operation or a program verify operation. In step 934, a temperature associated with the set of memory cells is determined. In one example, an on-die temperature sensor may be used to determine the temperature associated with the set of memory cells. In step 936, a number of data latches for storing the set of data states is identified. The number of data latches for the memory operation may correspond with a number of memory arrays enabled for the memory operation. In step 938, a first source voltage for one or more transistors of the set of data latches is determined based on the temperature and the number of data latches. In one embodiment, the first source voltage may be set to 0.7V if the number of data latches is greater than a threshold number of data latches (e.g., is greater than 16K data latches). However, if the number of data latches is not greater than the threshold number of data latches, then the first source voltage may be set to 0V. In another embodiment, the first source voltage may be set to 0.7V if the temperature is greater than a threshold temperature (e.g., if the temperature is greater than 55 degrees Celsius). However, if the temperature is not greater than the threshold temperature, then the first source voltage may be set to 0V.

In step 940, a first well voltage for the one or more transistors of the set of data latches is determined based on the temperature and the number of data latches. In one embodiment, the first well voltage for the one or more transistors may be set to 0V if the number of data latches is less than a threshold number of data latches (e.g., if the number of data latches is less than 16K data latches). However, if the number of data latches is greater than the threshold number of data latches, then the first well voltage for the one or more transistors may be set to negative 1V. In another embodiment, if the temperature is greater than a threshold temperature (e.g., is greater than 55 degrees Celsius), then the first well voltage for the one or more transistors may be set to negative 1V. However, if the temperature associated with the set of memory cells is not greater than the threshold temperature, then the first well voltage for the one or more transistors may be set to 0V.

In step 942, one or more sources of the one or more transistors are set to the first source voltage. The one or more sources may correspond with one or more source diffusions, such as the N+ diffusion 864 in FIG. 8D. In step 944, one or more wells of the one or more transistors are set to the first well voltage. The one or more transistors may correspond with the low VT NMOS transistors 840-841 depicted in FIG. 8C. In step 946, data associated with the set of data states is stored using the set of data latches while the one or more sources are set to the first source voltage and the one or more wells are set to the first well voltage. In step 948, a second source voltage greater than the source voltage is determined. In step 950, a second well voltage less than the well voltage is determined. In step 952, the one or more sources of the one or more transistors are set to the second source voltage subsequent to storing the data associated with the set of data states using the set of data latches. In step 954, the one or more wells of the one or more transistors are set to the second well voltage subsequent to storing the data associated with the set of data states using the set of data latches. In step 956, the data associated with the set of data states is transferred. In one example, the data associated with the set of data states is transferred from the set of data latches to control circuitry, such as control circuitry 310 in FIG. 2A.

One embodiment of the disclosed technology includes a read circuit and a data latch circuit in communication with the read circuit. The read circuit configured to read data from a memory cell. The data latch circuit includes a transistor in a non-conducting state. The data latch circuit configured to latch the data from the read circuit and increase a threshold voltage of the transistor after the data is latched.

One embodiment of the disclosed technology includes detecting that a read operation to read a set of data from a set of memory cells is to be performed, identifying a set of data latches for storing the set of data, determining a source voltage for one or more transistors of the set of data latches, determining a well voltage for one or more transistors of the set of data latches, setting one or more sources of the one or more transistors to the source voltage, setting one or more wells of the one or more transistors to the well voltage, reading the set of data from the set of memory cells, storing the set of data using the set of data latches while the one or more sources are set to the source voltage and the one or more wells are set to the well voltage, determining a second source voltage greater than the source voltage, and setting the one or more sources of the one or more transistors to the second source voltage subsequent to storing the set of data using the set of data latches.

One embodiment of the disclosed technology includes a sensing circuit and a data latch circuit. The sensing circuit configured to determine a data state of a memory cell. The data latch circuit including a transistor. The data latch circuit configured to latch data corresponding with the data state of the memory cell while a source to bulk voltage of the transistor is set to a first voltage. The data latch circuit configured to hold the data corresponding with the data state of the memory cell while the source to bulk voltage of the transistor is set to a second voltage greater than the first voltage.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

Two devices may be "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a read circuit configured to read data from a memory cell;
a data latch circuit in communication with the read circuit, the data latch circuit includes a transistor in a non-conducting state, the data latch circuit configured to latch the data from the read circuit and increase a threshold voltage of the transistor after the data is latched; and
a control circuit configured to determine a chip temperature and apply a first voltage to a source of the transistor to increase the threshold voltage of the transistor after the data is latched based on the chip temperature.

2. The apparatus of claim 1, wherein:
the memory cell is arranged on a first die; and
the data latch circuit is arranged on a second die.

3. The apparatus of claim 1, wherein:
the data latch circuit is configured to increase a source to bulk voltage of the transistor after the data is latched.

4. The apparatus of claim 1, wherein:
the transistor comprises an NMOS transistor.

5. The apparatus of claim 1, wherein:
the transistor comprises an NMOS transistor and a body of the transistor is decreased after the data is latched.

6. The apparatus of claim 1, wherein:
the control circuit is configured to determine a number of enabled data latches and determine the first voltage to be applied to the source of the transistor based on the number of enabled data latches.

7. The apparatus of claim 1, wherein:
the memory cell is arranged on a first die and the data latch circuit is arranged on the first die.

8. The apparatus of claim 1, wherein:
the control circuit is configured to identify a number of enabled data latches and determine the first voltage to be applied to the source of the transistor based on the number of enabled data latches.

9. The apparatus of claim 1, wherein:
the memory cell comprises a floating-gate transistor.

10. A method, comprising:
detecting that a read operation to read a set of data from a set of memory cells is to be performed;
identifying a set of data latches for storing the set of data;
determining a source voltage for one or more transistors of the set of data latches;
determining a well voltage for the one or more transistors of the set of data latches;
setting one or more sources of the one or more transistors to the source voltage prior to storing the set of data using the set of data latches;
setting one or more wells of the one or more transistors to the well voltage prior to storing the set of data using the set of data latches;
reading the set of data from the set of memory cells;
storing the set of data using the set of data latches while the one or more sources are set to the source voltage and the one or more wells are set to the well voltage;
determining a chip temperature;
determining a second source voltage greater than the source voltage based on the chip temperature; and
applying the second source voltage greater than the source voltage to the one or more sources of the one or more transistors to increase one or more threshold voltages of the one or more transistors after the set of data has been latched using the one or more transistors.

11. The method of claim 10, further comprising:
determining a second well voltage less than the well voltage; and
setting the one or more wells of the one or more transistors to the second well voltage after the set of data has been latched using the one or more transistors.

12. An apparatus, comprising:
a sensing circuit configured to determine a data state of a memory cell;
a data latch circuit including a transistor, the data latch circuit configured to latch data corresponding with the data state of the memory cell while a source of the transistor is set to a first voltage, the data latch circuit configured to hold the data corresponding with the data state of the memory cell while the source of the transistor is set to a second voltage greater than the first voltage; and
a control circuit configured to determine a chip temperature and apply the second voltage to the source of the transistor to increase a threshold voltage of the transistor after the data has been latched based on the chip temperature.

13. The apparatus of claim 12, wherein:
the data latch circuit is configured to latch the data corresponding with the data state of the memory cell while a source to bulk voltage of the transistor is 0V and hold the data corresponding with the data state of the memory cell while the source to bulk voltage of the transistor is greater than 600 mV.

14. The apparatus of claim 12, wherein:
the memory cell is arranged on a first die; and
the data latch circuit is arranged on a second die.

15. The apparatus of claim 12, wherein:
the control circuit is configured to set a bulk of the transistor to a third voltage less than the first voltage.

16. The apparatus of claim 12, wherein:
the control circuit is configured to detect that the chip temperature has exceeded a temperature threshold.

17. The apparatus of claim 12, wherein:
the control circuit is configured to determine a number of data latches enabled during a particular time period and determine the first voltage based on the number of data latches enabled during the particular time period.

18. The apparatus of claim 12, wherein:
the transistor comprises an NMOS transistor.

* * * * *